(12) United States Patent
Fonseca et al.

(10) Patent No.: US 8,283,111 B2
(45) Date of Patent: Oct. 9, 2012

(54) METHOD FOR CREATING GRAY-SCALE FEATURES FOR DUAL TONE DEVELOPMENT PROCESSES

(75) Inventors: Carlos A. Fonseca, Fishkill, NY (US); Mark Somervell, Austin, TX (US); Steven Scheer, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 865 days.

(21) Appl. No.: 12/334,852

(22) Filed: Dec. 15, 2008

(65) Prior Publication Data
US 2010/0068654 A1 Mar. 18, 2010

Related U.S. Application Data

(60) Provisional application No. 61/097,560, filed on Sep. 17, 2008, provisional application No. 61/098,723, filed on Sep. 19, 2008.

(51) Int. Cl.
*G03F 7/20* (2006.01)

(52) U.S. Cl. ..................................... 430/322

(58) Field of Classification Search ............... 430/30, 430/322
See application file for complete search history.

(56) References Cited

U.S. PATENT DOCUMENTS

| 4,902,899 A * | 2/1990 | Lin et al. ............. 250/492.1 |
| 2009/0068589 A1* | 3/2009 | Fedynyshyn ............ 430/285.1 |

* cited by examiner

*Primary Examiner* — Cynthia Kelly
*Assistant Examiner* — Brittany Raymond
(74) *Attorney, Agent, or Firm* — Wood, Herron & Evans, LLP

(57) ABSTRACT

A method of patterning a substrate using a dual-tone development process is described. The patterning method comprises forming a layer of radiation-sensitive material on a substrate, wherein the layer of radiation-sensitive material comprises a dual tone resist. Thereafter, the patterning method comprises performing one or more exposures of the layer of radiation-sensitive material to one or more patterns of radiation, wherein at least one of the one or more exposures comprises using a mask having a dual-tone mask pattern region configured for printing dual tone features and a half-tone mask pattern region configured for printing half-tone features. Furthermore, the half-tone mask pattern region is optimized for use with the dual tone resist.

11 Claims, 31 Drawing Sheets

METHOD FOR CREATING GRAY-SCALE FEATURES FOR DUAL TONE DEVELOPMENT PROCESSES

CROSS-REFERENCE TO RELATED APPLICATIONS

This application is related to and claims priority to U.S. provisional application Ser. No. 61/097,560 filed on Sep. 17, 2008, and U.S. provisional application Ser. No. 61/098,723 filed on Sep. 19, 2008; the entire contents of which are herein incorporated by reference.

BACKGROUND OF THE INVENTION

1. Field of the Invention

The invention relates to a method for patterning a substrate. In particular, the invention relates to a method for patterning a substrate using dual-tone development.

2. Description of Related Art

In material processing methodologies, such as those used in the fabrication of micro-electronic devices, pattern etching is often utilized to define the intricate patterns associated with various integrated circuit elements. Pattern etching comprises applying a patterned layer of radiation-sensitive material, such as photo-resist, to a thin film on an upper surface of a substrate, and transferring the pattern formed in the layer of radiation-sensitive material to the underlying thin film by etching.

The patterning of the radiation-sensitive material generally involves coating an upper surface of the substrate with a thin film of radiation-sensitive material and then exposing the thin film of radiation-sensitive material to a pattern of radiation by projecting radiation from a radiation source through a mask using, for example, a photolithography system. Thereafter, a developing process is performed, during which the removal of the irradiated regions of the radiation-sensitive material occurs (as in the case of positive-tone photo-resist), or the removal of non-irradiated regions occurs (as in the case of negative-tone photo-resist). The remaining radiation-sensitive material exposes the underlying substrate surface in a pattern that is ready to be etched into the surface.

As an example, for positive-tone pattern development, a typical lithographic patterning technique is shown in FIGS. 1A and 1B. As shown in FIG. 1A, a layer of positive-tone photo-resist 102 is formed on a substrate 101. The layer of photo-resist 102 is exposed to electromagnetic (EM) radiation 107 through a mask 103. Mask 103 includes transparent portions 104 and opaque features 108 that form a pattern, as shown in FIG. 1A. A distance (or pitch) 109 between opaque features 108 is shown in FIG. 1A. The transparent portions 104 transmit EM radiation 107 to the layer of positive-tone photo-resist 102, and the opaque features 108 prevent EM radiation 107 from being transmitted to the layer positive-tone photo-resist 102. FIG. 1A shows the layer of positive-tone photo-resist 102 having exposed portions 105 that are exposed to EM radiation 107 and unexposed portions 106 that are not exposed to EM radiation 107. As shown in FIG. 1A, mask features 108 are imaged onto the layer of positive-tone photo-resist 102 to produce corresponding photo-resist features aligned with unexposed portions 106.

As shown in FIG. 1B, after removing exposed portions 105 of the layer of positive-tone photo-resist 102, unexposed portions 106 remain on substrate 101 and form the pattern transferred from mask 103 to substrate 101. As shown in FIGS. 1A and 1B, mask features 108 are imaged onto the layer of positive-tone photo-resist 102 to produce corresponding photo-resist features (i.e., unexposed portions 106). As shown in FIGS. 1A and 1B, pitch 110 between unexposed portions 106 is determined by pitch 109 between features 108 of mask 103.

As another example, for negative-tone pattern development, a typical lithographic patterning technique is shown in FIGS. 2A and 2B. As shown in FIG. 2A, a layer of negative-tone photo-resist 202 is formed on a substrate 201. The layer of negative-tone photo-resist 202 is exposed to the EM radiation 207 through a mask 203. The mask 203 includes transparent features 204 that form a pattern and opaque portions 208, as shown in FIG. 2A. A distance (pitch) 209 between transparent features 204 is shown in FIG. 2A. Transparent features 204 transmit EM radiation 207 to the layer of negative-tone photo-resist 202, and opaque portions 208 prevent EM radiation 207 from being transmitted to the layer of negative-tone photo-resist 202. FIG. 2A shows the layer of negative-tone photo-resist 202 having exposed portions 205 that are exposed to EM radiation 207 and unexposed portions 206 that are not exposed to EM radiation 207. As shown in FIG. 1A, mask features 204 are imaged onto the layer of negative-tone photo-resist 202 to produce corresponding photo-resist features aligned with exposed portions 205.

As shown in FIG. 2B, after removing unexposed portions 206 of the layer of negative-tone photo-resist 202, exposed portions 205 remain on substrate 201 and form a pattern transferred from mask 203 to substrate 201. As shown in FIGS. 2A and 2B, mask features 204 are imaged onto the layer of negative-tone photo-resist 202 to produce corresponding photo-resist features (i.e., exposed portions 205). Pitch 210 between exposed portions 205 is determined by pitch 209 between features 204 of mask 203, as shown in FIGS. 2A and 2B.

Photolithographic systems for performing the above-described material processing methodologies have become a mainstay of semiconductor device patterning for the last three decades, and are expected to continue in that role down to 32 nm resolution, and less. Typically, in both positive-tone and negative-tone pattern development, the minimum distance (i.e., pitch) between the center of features of patterns transferred from the mask to the substrate by a lithography system defines the patterning resolution.

As indicated above, the patterning resolution ($r_o$) of a photolithographic system determines the minimum size of devices that can be made using the system. Having a given lithographic constant $k_1$, the resolution is given by the equation $$r_o = k_1 \lambda / NA, \qquad (1)$$

where $\lambda$ is the operational wavelength of the EM radiation, and NA is the numerical aperture given by the equation $$NA = n \cdot \sin \theta_o. \qquad (2)$$

Angle $\theta_o$ is the angular semi-aperture of the photo-lithography system, and n is the index of refraction of the material filling the space between the system and the substrate to be patterned.

Following equation (1), conventional methods of resolution improvement have lead to three trends in photolithographic technology: (1) reduction in wavelength $\lambda$ from mercury g-line (436 nm) to the 193 nm excimer laser, and further to 157 nm and the still developing extreme-ultraviolet (EUV) wavelengths; (2) implementation of resolution enhancement techniques (RETs) such as phase-shifting masks, and off-axis illumination that have lead to a reduction in the lithographic constant $k_1$ from approximately a value of 0.6 to values approaching 0.25; and (3) increases in the numerical aperture (NA) via improvements in optical designs, manufacturing techniques, and metrology. These latter improvements have created increases in NA from approximately 0.35 to values greater than 1.35.

Immersion lithography provides another possibility for increasing the NA of an optical system, such as a lithographic system. In immersion lithography, a substrate is immersed in a high-index of refraction fluid (also referred to as an immersion medium), such that the space between a final optical element and the substrate is filled with a high-index fluid (i.e., n>1). Accordingly, immersion provides the possibility of increasing resolution by increasing the NA (see equations (1), and (2)).

However, many of these approaches, including EUV lithography, RET lithography, and immersion lithography, have added considerable cost and complexity to lithography equipment. Furthermore, many of these approaches continue to face challenges in integration and challenges in extending their resolution limits to finer design nodes.

Therefore, another trend in photolithographic technology is to utilize a double patterning approach, which has been introduced to allow the patterning of smaller features at a smaller pitch than what is currently possible with standard lithographic techniques. One approach to reduce the feature size is to use standard lithographic pattern and etch techniques on the same substrate twice, thereby forming larger patterns spaced closely together to achieve a smaller feature size than would be possible by single exposure. During double patterning, a layer of radiation-sensitive material on the substrate is exposed to a first pattern, the first pattern is developed in the radiation-sensitive material, the first pattern formed in the radiation-sensitive material is transferred to an underlying layer using an etching process, and then this series of steps is repeated for a second pattern, while shifting the second pattern relative to the first pattern. Herein, the double patterning approach may require an excessive number of steps, including exiting the coating/developing tool and re-application of a second layer of radiation-sensitive material.

Another approach to double the resolution of a lithographic pattern is to utilize a dual-tone development approach, wherein a layer of radiation-sensitive material on the substrate is exposed to a pattern of radiation, and then a double pattern is developed into the layer of radiation-sensitive material by performing a positive-tone development and a negative-tone development. However, current dual-tone development approaches lack the ability to adjust, control and/or optimize the double pattern formed on the substrate. Moreover, current dual-tone development approaches lack methodologies for addressing both critical areas, including finer features requiring more stringent lithographic printing tolerances such as minimum pitch features, gate structures, etc., and less critical areas, including larger features (relative to minimum dimension features) requiring less stringent lithographic printing tolerances such as landing pads, border features, label characters, etc.

SUMMARY OF THE INVENTION

The invention relates to a method for patterning a substrate. In particular, the invention relates to a method for patterning a substrate using dual tone development. Further, the invention relates to the implementation of gray-scaling techniques in a dual tone development process.

According to an embodiment, a method of patterning a substrate using a dual-tone development process is described. The patterning method comprises forming a layer of radiation-sensitive material on a substrate, wherein the layer of radiation-sensitive material comprises a dual tone photo-resist. Thereafter, the patterning method comprises performing one or more exposures of the layer of radiation-sensitive material to one or more patterns of radiation, wherein at least one of the one or more exposures comprises using a mask having a dual-tone mask pattern region configured for printing dual tone features and a half-tone mask pattern region configured for printing half-tone features. Furthermore, the half-tone mask pattern region is optimized for use with said dual tone photo-resist.

According to another embodiment, a method of optimizing gray-scale features in a dual-tone development process is described. The method comprises: identifying one or more patterns for printing gray-scale features using a half-tone mask with the dual-tone development process; defining one or more criteria for evaluating an accuracy of printing the one or more patterns using the half-tone mask with the dual-tone development process; selecting a set of one or more rules for the half-tone mask; simulating a printing of the one or more patterns using the set of one or more rules and a calibrated dual-tone resist process model; assessing simulated results from the simulating the printing of the one or more patterns using the one or more criteria for evaluating the accuracy of the printing; and adjusting at least one of the one or more rules if the assessing is unsatisfactory.

According to another embodiment, a method of optimizing gray-scale features in a dual-tone development process is described. The method comprises: preparing one or more patterns for printing gray-scale features using a half-tone mask with the dual-tone development process; defining one or more criteria for evaluating an accuracy of printing the one or more patterns using the half-tone mask with the dual-tone development process; selecting a set of one or more rules for the half-tone mask; creating the half-tone mask using the set of one or more rules; experimentally verifying a printing of the one or more patterns using the half-tone mask; assessing the experimentally verifying of the printing of the one or more patterns using the one or more criteria for evaluating the accuracy of the printing; and adjusting at least one of the one or more rules if the assessing is unsatisfactory.

According to yet another embodiment, a method of patterning a substrate using a dual-tone development process is described. The method comprises: indentifying a critical layout for printing critical features and/or areas; identifying a gray-scaling layout for printing gray-scaling features and/or areas; refining the gray-scaling layout; resolving layout conflicts; generating a final gray-scaling layout using an optimized set of one or more rules for gray-scaling; and applying the final gray-scaling layout.

DETAILED DESCRIPTION OF EXEMPLARY EMBODIMENTS

Figure 1A:
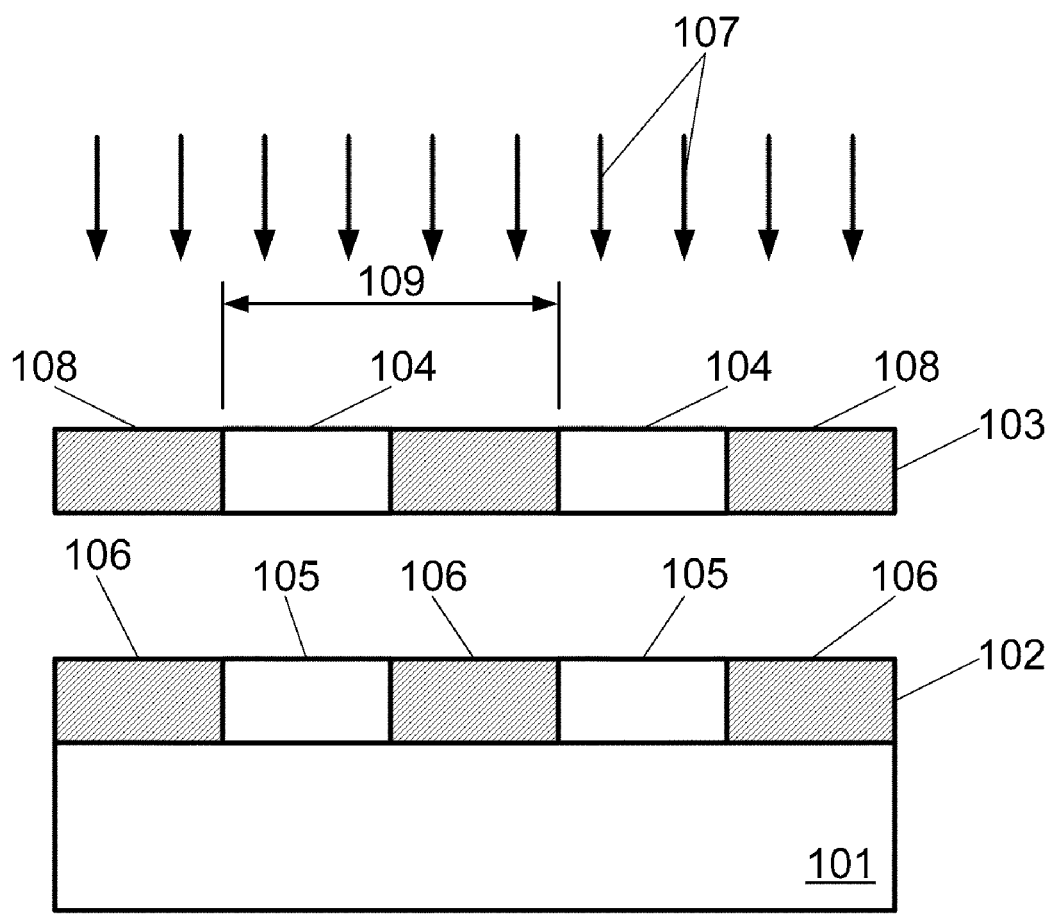
FIGS. 1A and 1B illustrate a lithographic patterning technique utilizing a positive-tone photo-resist according to the prior art.
Figure 1B:
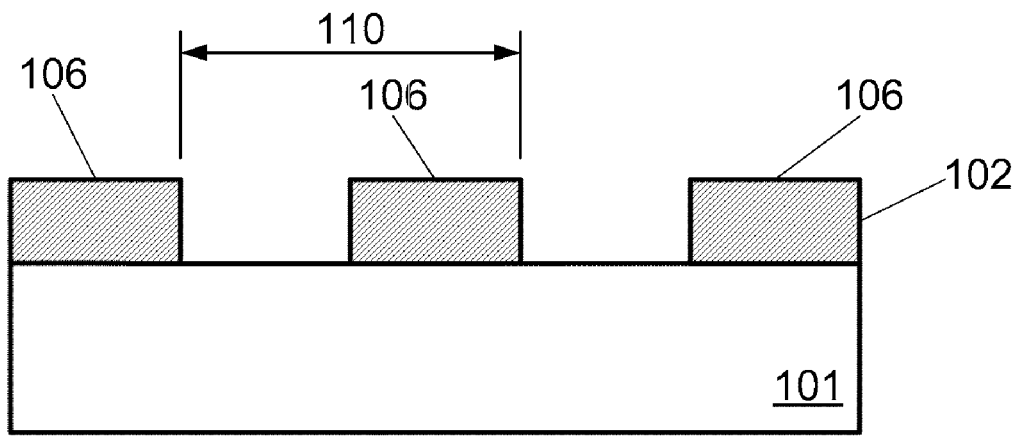
Figure 2A:
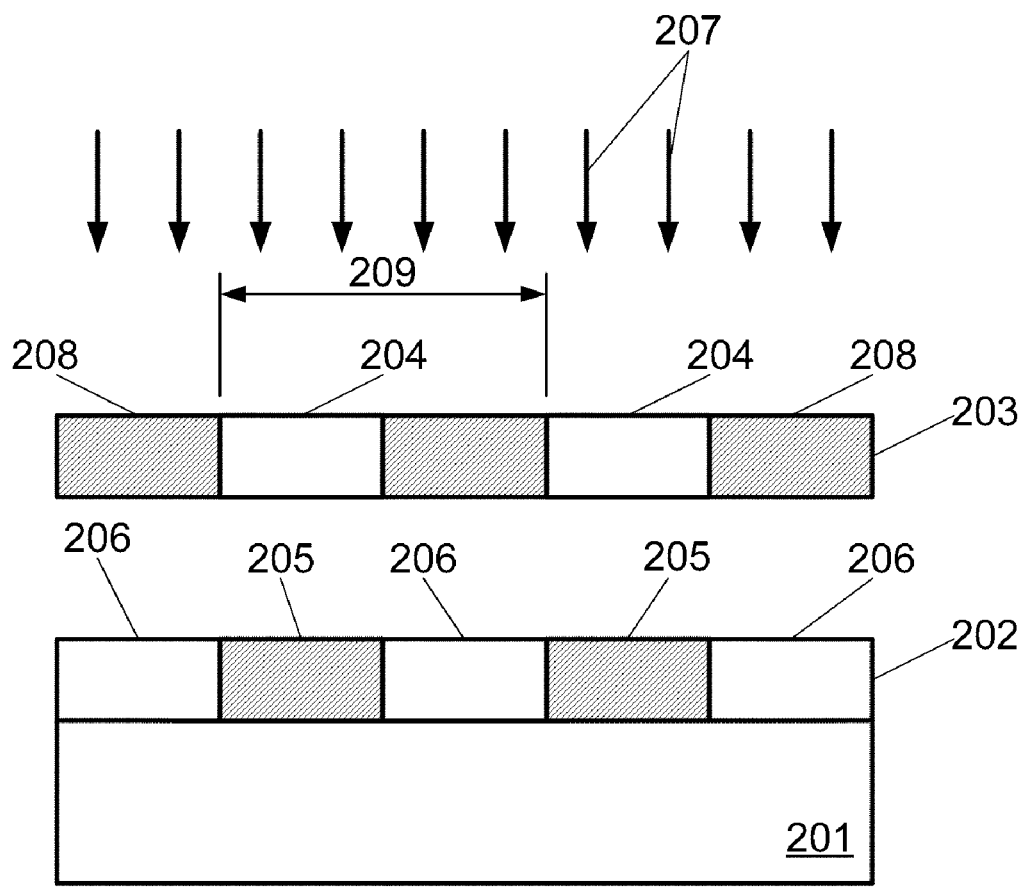
FIGS. 2A and 2B illustrate a lithographic patterning technique utilizing a negative-tone photo-resist according to the prior art.
Figure 2B:
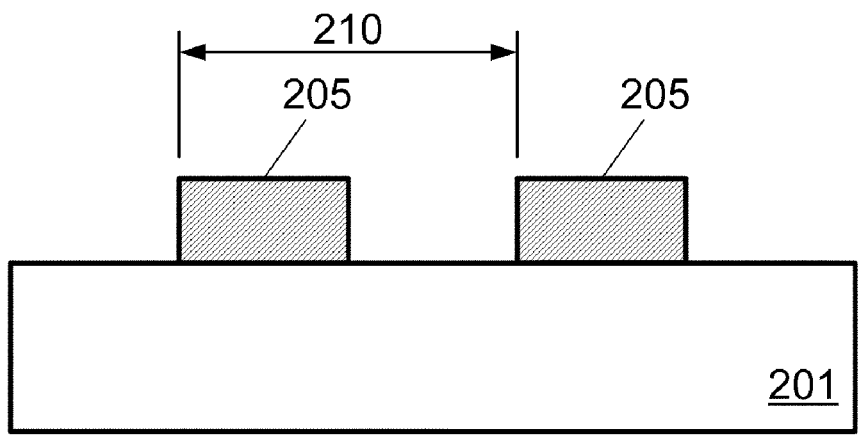

A method for patterning a substrate is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" or variation thereof means that a particular feature, structure, material, or characteristic described in connection with the embodiment is included in at least one embodiment of the invention, but do not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Methods for patterning a substrate, including methods to reduce the minimum pitch of a pattern that can be transferred onto a substrate for a given lithographic tool and mask, are described herein. Multiple chemical treatments on exposed radiation-sensitive materials, such as photo-resist, are used to achieve a reduction in a lithographic pitch of about a factor of two.

According to an embodiment, a method of patterning a substrate to double the resolution of a lithographic pattern is described. The patterning process utilizes a dual-tone development approach, wherein a layer of radiation-sensitive material applied to the substrate is exposed to a pattern of radiation, and then a double pattern is developed into the layer of radiation-sensitive material by performing a positive-tone development followed by a negative-tone development. Additionally, a critical dimension of the features formed in the double pattern may be adjusted, controlled and/or optimized to meet pre-specified pattern requirements that may include a pre-specified critical dimension. This adjusting, controlling and/or optimizing include altering any process step, or altering a combination of steps in the double patterning process. For example, the altering of any step or a combination of steps may include adding, subtracting, and/or re-ordering the combination of steps.

Figure 3:
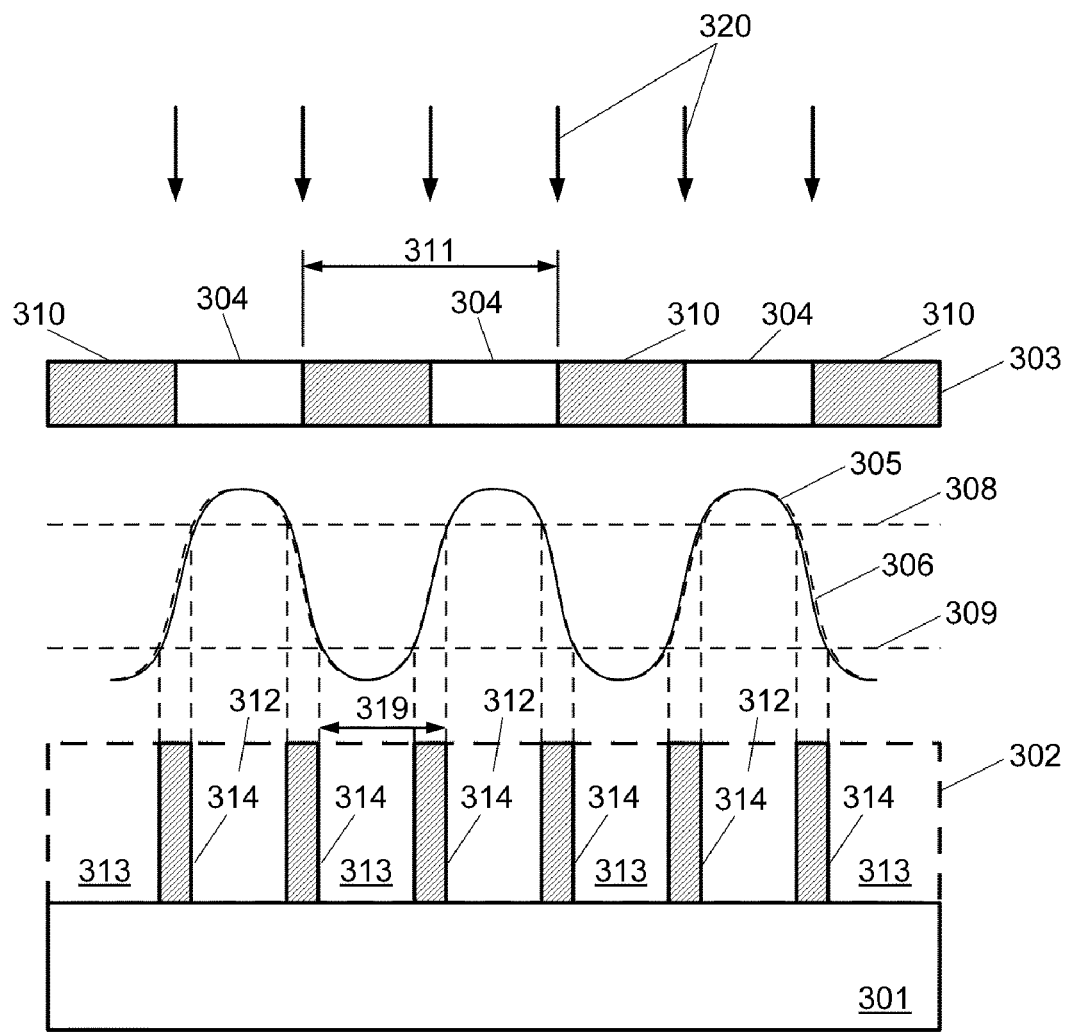
FIG. 3 illustrates a method of patterning a substrate.

FIG. 3 illustrates a method of transferring a pattern from a mask onto a substrate according to one embodiment. A layer of radiation-sensitive material 302, such as photo-resist, is formed on a substrate 301, and then it is exposed to radiation 320 from a radiation source of a lithography system (not shown) using a mask 303. Mask 303 has opaque features 310 that are periodically spaced at a mask pitch 311 and transparent portions 304, as shown in FIG. 3.

According to one embodiment, the radiation-sensitive material 302 comprises photo-resist. According to another embodiment, the radiation-sensitive material 302 comprises a 248 nm photo-resist, a 193 nm photo-resist, a 157 nm photo-resist, or an extreme ultraviolet photo-resist, or a combination of two or more thereof. According to another embodiment, the radiation-sensitive material 302 comprises a positive-tone photo-resist, or a negative-tone photo-resist. According to another embodiment, the radiation-sensitive material 302 comprises a dual-tone photo-resist. A dual-tone photo-resist may be characterized as a photo-resist that behaves as a positive-tone photo-resist or a negative-tone photo-resist depending upon the developing chemistry that is utilized. According to another embodiment, the radiation-sensitive material 302 comprises a photo-resist that switches solubility due to a change in polarity upon exposure to the pattern of radiation and an optionally elevation of the temperature of the substrate following the exposure. According to another embodiment, the radiation-sensitive material 302 comprises a photo-resist that provides acid-catalyzed deprotection upon exposure to the pattern of radiation and an optional elevation of the temperature of the substrate following the exposure.

FIG. 3 shows a radiation exposure profile 305 and a resist response profile 306 of a response produced in the layer of radiation-sensitive material 302 by a pattern of radiation resulting from the projection of radiation 320 through mask 303 using the lithography system. As shown in FIG. 3, first radiation-sensitive material portions 312 that correspond to transparent portions 304 receive a high radiation exposure from radiation 320, second radiation-sensitive material portions 313 that correspond to opaque features 310 receive a low radiation exposure from radiation 320, and third radiation-sensitive material portions 314 that approximately correspond to edges of opaque features 310 receive an intermediate radiation exposure from radiation 320. As shown in FIG. 3, the resist response profile 306 corresponding to the first radiation-sensitive material portions 312 of radiation-sensitive material 302 is higher than an upper threshold 308, while the resist response profile 306 corresponding to the second radiation-sensitive material portions 313 is lower than a lower threshold 309. Further, the resist response profile 306 corresponding to the third radiation-sensitive material portions 314 lies between the lower threshold 309 and the upper threshold 308.

In one embodiment, when the layer of radiation-sensitive material 302 includes a positive-tone photo-resist, resist response profile 306 may represent a chemical concentration of deprotected polymers in the layer of radiation-sensitive material 302 that is approximately proportional to radiation exposure profile 305, as shown in FIG. 3. In another embodiment, when the layer of radiation-sensitive material 302 includes a positive-tone photo-resist, resist response profile 306 may be an acid concentration in the layer of radiation-sensitive material 302 that is proportional to radiation exposure profile 305. In another embodiment, when the layer of radiation-sensitive material 302 includes a negative-tone photo-resist, resist response profile 306 is an average polymer molecular weight in the layer of radiation-sensitive material 302 that is proportional to radiation exposure profile 305.

In one embodiment, upper threshold 308 corresponds to a first threshold of solubility of the layer of radiation-sensitive material 302 when a first chemistry is applied. In one embodiment, lower threshold 309 corresponds to a second threshold of solubility of the layer of radiation-sensitive material 302 when a second chemistry is applied. In one embodiment, first radiation-sensitive material portions 312 of the layer of radiation-sensitive material 302 that correspond to transparent portions 304 that have high radiation exposure in radiation exposure profile 305 are selectively removed from substrate 301 using a first chemistry. Second radiation-sensitive material portions 313 of the layer of radiation-sensitive material 302 that have low radiation exposure in the radiation exposure profile 305 are selectively removed from substrate 301 using a second chemistry. The third radiation-sensitive material portions 314 that correspond to approximately the edges of opaque features 310 that have intermediate exposure in the radiation exposure profile 305 (i.e., radiation exposure between the upper threshold 308 and the lower threshold 309) remain on substrate 301 intact, as shown in FIG. 3. Selectively removing first radiation-sensitive material portions 312 and second radiation-sensitive material portions 313 using different chemistries while leaving third radiation-sensitive material portions 314 on substrate 301 intact.

In one embodiment, for first radiation-sensitive material portions 312, resist response profile 306 includes a concentration of acid in the layer of radiation-sensitive material 302 that is higher than an upper threshold 308 of acid concentration. In one embodiment, upper threshold 308 represents an acid level solubility threshold of the layer of radiation-sensitive material 302. For example, if an acid concentration in the layer of radiation-sensitive material 302 is higher than the upper threshold 308 of acid concentration, the layer of radiation-sensitive material 302 becomes soluble when a first chemistry is applied.

In one embodiment, for second radiation-sensitive material portions 313, resist response profile 306 includes a concentration of acid in the layer of radiation-sensitive material that is lower than lower threshold 309 of acid concentration. In one embodiment, lower threshold 309 represents another acid level solubility threshold of the layer of radiation-sensitive material 302. For example, if acid concentration in the layer of radiation-sensitive material 302 is lower than lower threshold 309 of acid concentration, the layer of radiation-sensitive material 302 becomes soluble when a second chemistry is applied.

In one embodiment, the layer of radiation-sensitive material 302 includes an upper acid concentration threshold in ranging from about 30% to about 60% of the clear field acid level and a lower acid concentration threshold ranging from about 10% to about 25% of the clear field acid concentration. In one embodiment, the clear field acid concentration is defined as the acid level of the photo-resist completely exposed to radiation. In another embodiment, the clear field acid concentration is defined as the acid concentration when all the PAG (PhotoAcid Generation) material has reacted with radiation to produce acid species.

Due to diffraction of radiation 320, the third radiation-sensitive material portions 314 corresponding to intermediate radiation exposure are created. In one embodiment, third radiation-sensitive material portions 314 comprise an acid concentration between the upper acid concentration threshold and the lower acid concentration threshold. The first radiation-sensitive material portions 312 corresponding to high radiation exposure are selectively removed from the substrate using a first chemistry. The second radiation-sensitive material portions 313 corresponding to low radiation exposure are selectively removed from the substrate using a second chemistry. The third radiation-sensitive material portions 314 corresponding to intermediate radiation exposure remain on substrate 301 to form a pattern transferred by mask 303 and the lithography system.

As shown in FIG. 3, two photo-resist features (i.e., third radiation-sensitive material portions 314) are produced for every one mask feature 310, thereby doubling the amount of the pattern features on substrate 301. As a result, feature pitch 319 between the center of photo-resist features (i.e., third radiation-sensitive material portions 314) becomes twice as small as the mask pitch 311 of the mask 303, as shown in FIG. 3.

Figure 4A:
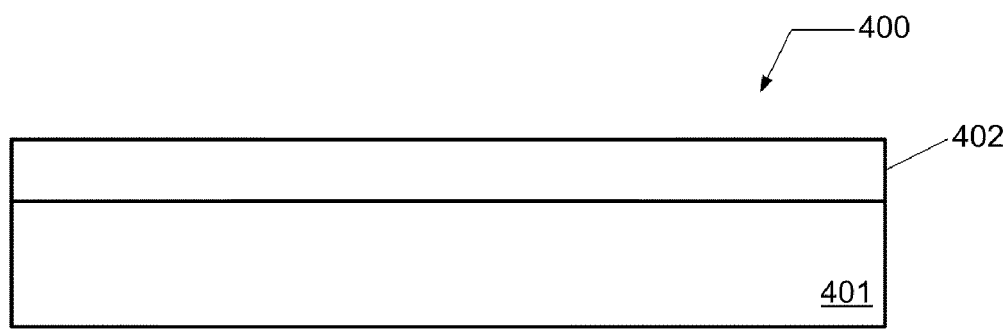
FIGS. 4A through 4D illustrate a method of patterning a substrate.

Referring now to FIGS. 4A through 4D, a method of patterning a substrate is illustrated according to another embodiment. As illustrated in FIG. 4A, a lithographic structure 400 is prepared by forming a layer of radiation-sensitive material 402 on a substrate 401.

The substrate 401 may comprise a semiconductor, e.g., a mono-crystalline silicon, germanium, and any other semiconductor. In alternate embodiments, substrate 401 may comprise any material used to fabricate integrated circuits, passive microelectronic devices (e.g., capacitors, inductors) and active microelectronic devices (e.g., transistors, photo-detectors, lasers, diodes). Substrate 401 may include insulating materials that separate such active and passive microelectronic devices from a conductive layer or layers that are formed on top of them. In one embodiment, substrate 401 comprises a p-type mono-crystalline silicon substrate that includes one or more insulating layers e.g., silicon dioxide, silicon nitride, sapphire, and other insulating materials.

As described above, the substrate 401 may comprise a film stack having one or more thin films disposed between the substrate 401 and the layer of radiation-sensitive material 402. Each thin film may comprise a conductive layer, a non-conductive layer, or a semi-conductive layer. For instance, the thin film may include a material layer comprising a metal, metal oxide, metal nitride, metal oxynitride, metal silicate, metal silicide, silicon, poly-crystalline silicon (poly-silicon), doped silicon, silicon dioxide, silicon nitride, silicon carbide, silicon oxynitride, etc. Additionally, for instance, the thin film may comprise a low dielectric constant (i.e., low-k) or ultra-low dielectric constant (i.e., ultra-low-k) dielectric layer having a nominal dielectric constant value less than the dielectric constant of $SiO_2$, which is approximately 4 (e.g., the dielectric constant for thermal silicon dioxide can range from 3.8 to 3.9). More specifically, the thin film may have a dielectric constant of less than 3.7, or a dielectric constant ranging from 1.6 to 3.7.

According to one embodiment, the radiation-sensitive material 402 comprises photo-resist. According to another embodiment, the radiation-sensitive material 402 comprises a 248 nm photo-resist, a 193 nm photo-resist, a 157 nm photo-resist, or an extreme ultraviolet photo-resist, or a combination of two or more thereof. According to another embodiment, the radiation-sensitive material 402 comprises a positive-tone photo-resist, or a negative-tone photo-resist. According to another embodiment, the radiation-sensitive material 402 comprises a dual-tone photo-resist. According to another embodiment, the radiation-sensitive material 402 comprises poly(hydroxystyrene)-based resist or a (meth)acrylate-based resist. According to another embodiment, the radiation-sensitive material 402 comprises a photo-resist that switches solubility due to a change in polarity upon exposure to the pattern of radiation and an optionally elevation of the temperature of the substrate following the exposure. According to another embodiment, the radiation-sensitive material 402 comprises a photo-resist that provides acid-catalyzed deprotection upon exposure to the pattern of radiation and an optional elevation of the temperature of the substrate following the exposure.

The layer of radiation-sensitive material 402 may be formed using a track system. For example, the track system can comprise a Clean Track ACT 8, ACT 12, or Lithius resist coating and developing system commercially available from Tokyo Electron Limited (TEL). Other systems and methods for forming a photo-resist film on a substrate are well known to those skilled in the art of spin-on resist technology.

Following the application of the layer of radiation-sensitive material 402 to substrate 401, the layer of radiation-sensitive material may be thermally treated in a post-application bake (PAB). For example, a temperature of the substrate may be elevated to about 50 degrees C. to about 200 degrees C. for a time duration of about 30 seconds to about 180 seconds. A track system having post-application substrate heating and cooling equipment may be used to perform the PAB. For example, the track system can comprise a Clean Track ACT 8, ACT 12, or Lithius resist coating and developing system commercially available from Tokyo Electron Limited (TEL). Other systems and methods for thermally treating an exposed photo-resist film on a substrate are well known to those skilled in the art of spin-on resist technology.

Figure 4B:
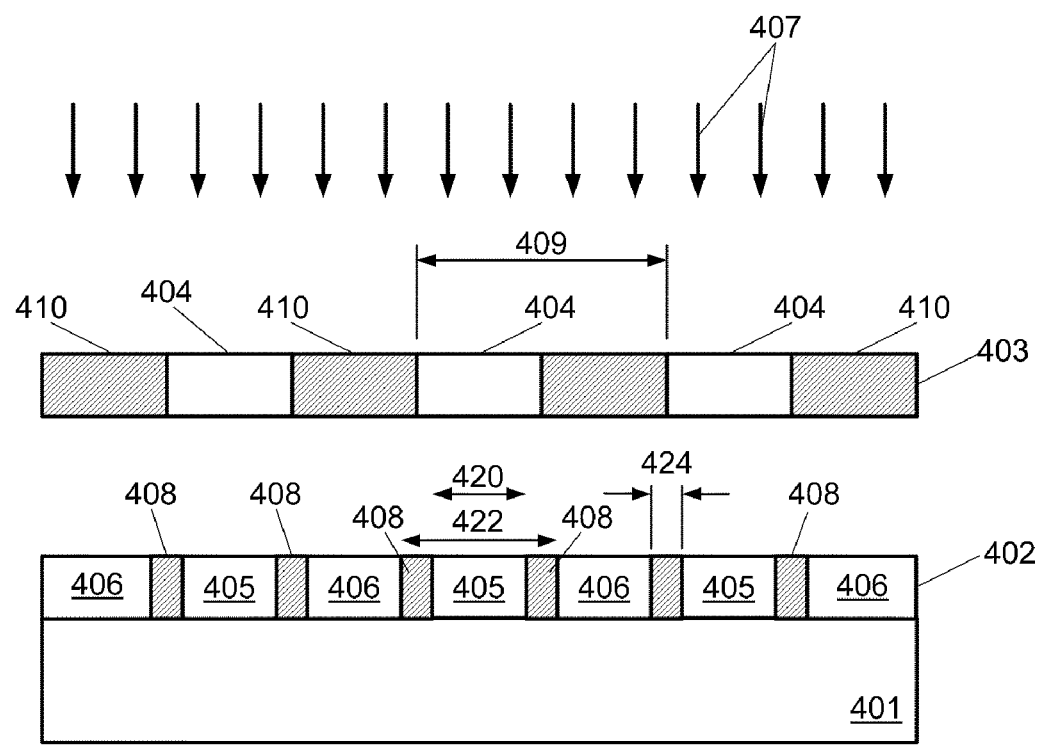

As shown in FIG. 4B, the layer of radiation-sensitive material 402 is exposed to radiation 407 through a mask 403. The mask 403 comprises opaque features 410 that prevent radiation 407 from being transmitted to the layer of radiation-sensitive material 402 and transparent portions 404 that transmit the radiation 407 to the layer of radiation-sensitive material 402. Mask 403 may include any mask suitable for use in wet or dry lithography, including wavelengths ranging from about 365 nm to about 13 nm. Mask 403 may include a binary mask or chrome on glass mask. Alternatively, mask 403 may include an alternating phase shift mask, or an embedded phase shift mask.

The exposure of the layer of radiation-sensitive material 402 to the pattern of EM radiation may be performed in a dry or wet photo-lithography system. The lithography system may be capable of providing a pattern of EM radiation at wavelengths of 365 nm, 248 nm, 193 nm, 157 nm, and 13 nm. The image pattern can be formed using any suitable conventional stepping lithographic system, or scanning lithographic system. For example, the photo-lithographic system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134). Mask 403 can be illuminated, for example, with normal incident light and off-axis illumination light, such as annular illumination, quadrupole illumination, and dipole illumination. These methods of illumination and exposing the layer of radiation-sensitive material 402 to radiation using the mask 403 are known to one of ordinary skill in the art of microelectronic device manufacturing.

As shown in FIG. 4B, radiation 407 is projected through mask 403 to the layer of radiation-sensitive material 402. The radiation exposure forms one or more first radiation-sensitive material portions 405, one or more second radiation-sensitive material portions 406, and one or more third radiation-sensitive material portions 408 in the layer of radiation-sensitive material 402. As shown in FIG. 4B, the one or more second radiation-sensitive material portions 406 that correspond to opaque features 410 of mask 403 have low exposure to radiation 407, the one or more first radiation-sensitive material portions 405 that correspond to transparent portions 404 of mask 403 have high exposure to radiation 407, and the one or more third radiation-sensitive material portions 408 that correspond approximately to the edges of opaque features 410 of mask 403 have an intermediate exposure to radiation 407. The one or more third radiation-sensitive material portions 408 of intermediate radiation exposure are created because of diffraction of radiation 407 from the edges of opaque features 410.

In one embodiment, the one or more first radiation-sensitive material portions 405 corresponding to high radiation exposure receive about 50% or more of radiation 407 incident on substrate 401, the one or more second radiation-sensitive material portions 406 corresponding to low radiation exposure receive less than 15% of the radiation 407 incident on substrate 401, and the one or more third radiation-sensitive material portions 408 corresponding to intermediate radiation exposure receive between about 15% and about 50% of the radiation 407 incident on substrate 401.

In one embodiment, high exposure to radiation 407 increases the concentration of an acid in the one or more first radiation-sensitive material portions 405 to a level higher than an upper acid concentration threshold. The upper acid concentration threshold is a first solubility threshold of the layer of radiation-sensitive material 402. In one embodiment, when the concentration of the acid in the one or more first radiation-sensitive material portions 405 increases to a level higher than the first threshold of solubility of the layer of radiation-sensitive material 402 (e.g., acid concentration threshold), the one or more first radiation-sensitive material portions 405 become soluble when a first chemistry is applied.

In another embodiment, when the chemical concentration of deprotected polymers in the one or more first radiation-sensitive material portions 405 increases to a level higher than the first threshold of solubility of the layer of radiation-sensitive material 402 (e.g., acid concentration threshold), the one or more first radiation-sensitive material portions 405 become soluble when a first chemistry is applied.

In yet another embodiment, when the average polymer molecular weight in the one or more first radiation-sensitive material portions 405 increases to a level higher than the first threshold of solubility of the layer of radiation-sensitive material 402, the one or more first radiation-sensitive material portions 405 become soluble when the first chemistry is applied.

In the one or more second radiation-sensitive material portions 406 corresponding to low radiation exposure, a concentration of an acid and/or chemical concentration of deprotected polymers is less than a lower threshold of solubility of the layer of radiation-sensitive material 402 (e.g., acid concentration threshold). The one or more second radiation-sensitive material portions 406 become soluble when a second chemistry is applied.

In another embodiment, when the concentration of average polymer molecular weight in one or more second radiation-sensitive material portions 406 is lower than the second threshold of solubility of the layer of radiation-sensitive material 402, the one or more second radiation-sensitive material portions 406 become soluble when the second chemistry is applied.

Typically, the first solubility threshold and the second solubility threshold are determined by a material property of the layer of radiation-sensitive material 402. The one or more third radiation-sensitive material portions 408 corresponding to an intermediate radiation exposure have an acid concentration between about the first solubility threshold and the second solubility threshold. That is, the one or more third radiation-sensitive material portions 408 are not soluble when each of the first chemistry and the second chemistry is applied to layer of radiation-sensitive material 402.

Following the exposure of the layer of radiation-sensitive material 402 to EM radiation, the exposed layer of radiation-sensitive material may be thermally treated in a post-exposure bake (PEB). For example, a temperature of the substrate may be elevated to about 50 degrees C. to about 200 degrees C. for a time duration of about 30 seconds to about 180 seconds. A track system having post-exposure substrate heating and cooling equipment may be used to perform the PEB. For example, the track system can comprise a Clean Track ACT 8, ACT 12, or Lithius resist coating and developing system commercially available from Tokyo Electron Limited (TEL). Other systems and methods for thermally treating an exposed photo-resist film on a substrate are well known to those skilled in the art of spin-on resist technology.

Referring still to FIG. 4B, the one or more first radiation-sensitive material portions 405 may be characterized by a first critical dimension 420. For example, the first critical dimension may be related to a positive-tone critical dimension following positive-tone developing. Additionally, the one or more second radiation-sensitive material portions 406 may be characterized by a second critical dimension 422. As shown in FIG. 4B, the second critical dimension 422 represents an inner dimension of the one or more second radiation-sensitive material portions 406 (beyond which these portions exist). For example, the second critical dimension 422 may be related to a negative-tone critical dimension following negative-tone developing. Furthermore, the one or more third radiation-sensitive material portions 408 may be characterized by a third critical dimension 424. For example, the third critical dimension 424 may be related to a feature critical dimension for the features 430 (see FIG. 4D) remaining on substrate 401.

Figure 4C:
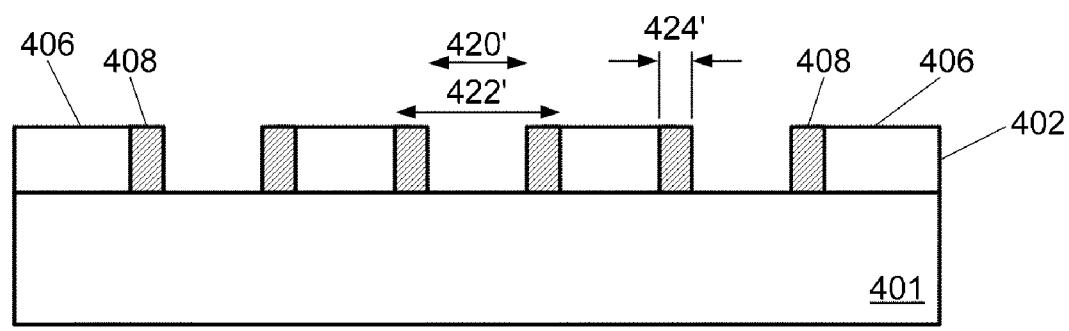

Referring now to FIG. 4C, the one or more first radiation-sensitive material portions 405 corresponding to high radiation exposure are selectively removed using a first developing process comprising a first chemistry. In one embodiment, the first chemistry to selectively remove the one or more first radiation-sensitive material portions 405 includes a base, e.g., alkali, amines, etc. In one embodiment, the first chemistry to selectively remove the one or more first radiation-sensitive material portions 405 includes tetramethylammonium hydroxide (TMAH). In another embodiment, the first chemistry to selectively remove the one or more first radiation-sensitive material portions 405 includes a base, water, and an optional surfactant.

In one embodiment, substrate 401 having the exposed layer of radiation-sensitive material 402 is immersed into a development solution containing the first chemistry to remove soluble one or more first radiation-sensitive material portions 405. Thereafter, the substrate 401 is dried. The developing process may be performed for a pre-specified time duration (e.g., about 30 seconds to about 180 seconds), a pre-specified temperature (e.g., room temperature), and a pre-specified pressure (atmospheric pressure). The developing process can include exposing the substrate to a developing solution in a developing system, such as a track system. For example, the track system can comprise a Clean Track ACT 8, ACT 12, or Lithius resist coating and developing system commercially available from Tokyo Electron Limited (TEL).

As shown in FIG. 4C, a first critical dimension 420' (corresponding to the one or more first radiation-sensitive material portions 405), a second critical dimension 422' (corresponding to the one or more second radiation-sensitive material portions 406), or a third critical dimension 424' (corresponding to the one or more third radiation-sensitive material portions 408) may be adjusted, controlled, and/or optimized, as will be discussed below.

As illustrated in FIG. 4C, the one or more second radiation-sensitive material portions 406 and the one or more third radiation sensitive material portions 408 remain on substrate 401.

Following the first developing process of the layer of radiation-sensitive material 402, the exposed layer of radiation-sensitive material may be thermally treated in another post-exposure bake (PEB). For example, a temperature of the substrate may be elevated to about 50 degrees C. to about 200 degrees C. for a time duration of about 30 seconds to about 180 seconds.

Figure 4D:
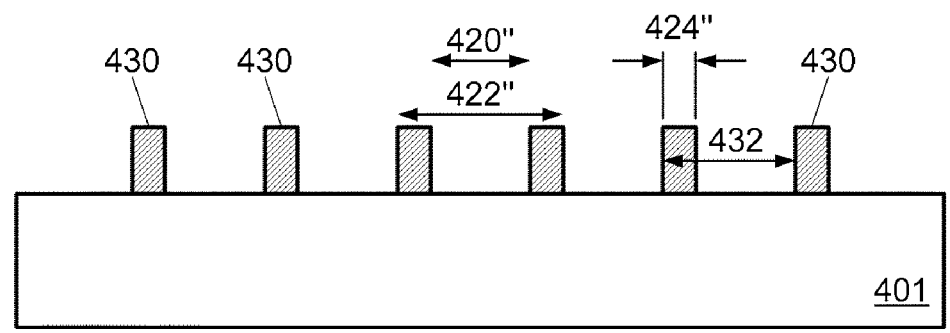

Referring now to FIG. 4D, the one or more second radiation-sensitive material portions 406 corresponding to low radiation exposure are selectively removed using a second developing process comprising a second chemistry. In one embodiment, the second chemistry to selectively remove the one or more second radiation-sensitive material portions 406 includes an organic solvent. In one embodiment, the second chemistry to selectively remove the one or more second radiation-sensitive material portions 406 includes an organic solvent, optionally water, and an optional surfactant. In one embodiment, the second chemistry to selectively remove the one or more second radiation-sensitive material portions 406 includes an alcohol or acetone.

In one embodiment, substrate 401 having the exposed layer of radiation-sensitive material 402 is immersed into a development solution containing the second chemistry to remove soluble one or more second radiation-sensitive material portions 406. Thereafter, the substrate 401 is dried. The developing process may be performed for a pre-specified time duration (e.g., about 30 seconds to about 180 seconds), a pre-specified temperature (e.g., room temperature), and a pre-specified pressure (atmospheric pressure). The developing process can include exposing the substrate to a developing solution in a developing system, such as a track system. For example, the track system can comprise a Clean Track ACT 8, ACT 12, or Lithius resist coating and developing system commercially available from Tokyo Electron Limited (TEL).

As shown in FIG. 4D, a first critical dimension 420" (corresponding to the one or more first radiation-sensitive material portions 405), a second critical dimension 422" (corresponding to the one or more second radiation-sensitive material portions 406), or a third critical dimension 424" (corresponding to the one or more third radiation-sensitive material portions 408) may be adjusted, controlled, and/or optimized, as will be discussed below.

As illustrated in FIG. 4D, the one or more second radiation-sensitive material portions 406 are removed, so that the one or more third radiation sensitive material portions 408 remain on substrate 401. Since an image corresponding to each mask feature (e.g., transparent portions 404) has two regions of intermediate radiation exposure (or transitions regions ranging from low radiation intensity to high radiation intensity), the resulting resist pattern comprises twice the number of features 430 than the mask pattern on mask 403. As illustrated in FIG. 4D, for every one transparent portion 404 of mask 403, two features 430 are produced and a reduced feature pitch 432 between features 430 is achieved.

Pitch 432 between features 430 is less than or equal to about half of mask pitch 409 between opaque features 410 of mask 403, as shown in FIG. 4D. In one embodiment, feature pitch 432 between features 430 may range from about 5 nm to about 30 nm.

The order of the positive-tone development (i.e., development using first chemistry) and the negative-tone development (i.e., development using second chemistry) of the layer of radiation-sensitive material 402, as described above with respect to FIGS. 4C and 4D, may be performed in any order without changing the resulting pattern. In one embodiment, the one or more first radiation-sensitive material portions 405 corresponding to high radiation exposure are selectively removed from substrate 401 before removing the one or more second radiation-sensitive material portions 406 corresponding to low radiation exposure from substrate 401. In another embodiment, the one or more first radiation-sensitive material portions 405 corresponding to high radiation exposure are selectively removed from substrate 401 after removing the one or more second radiation-sensitive material portions 406 corresponding to low radiation exposure from substrate 401.

Figure 5:
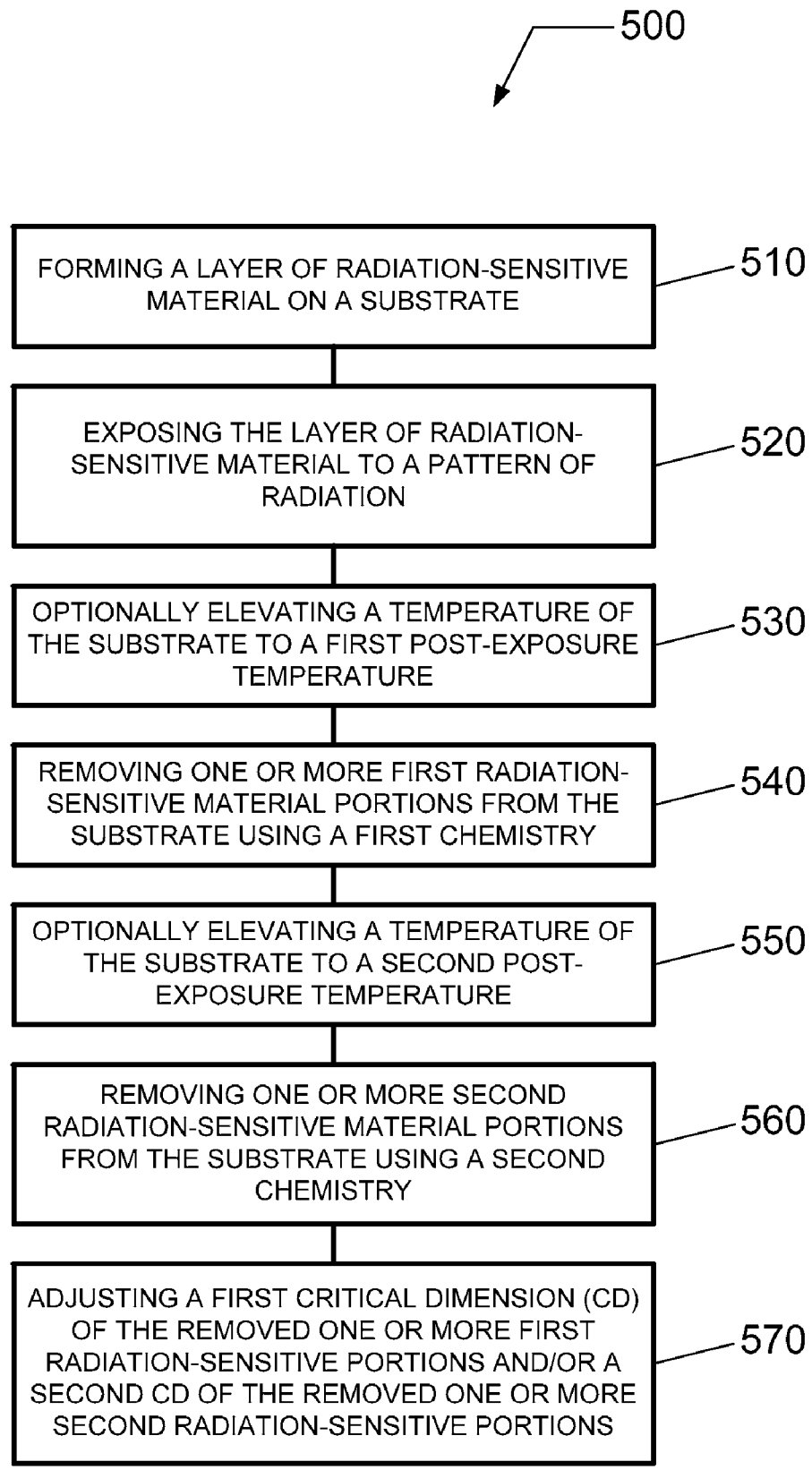
FIG. 5 illustrates a method of patterning a substrate.

Referring now to FIG. 5, a flow chart 500 of a method for patterning a substrate is presented according to an embodiment. Flow chart 500 begins in 510 when a layer of radiation-sensitive material is formed on a substrate and, in 520, the layer of radiation-sensitive material is exposed to a pattern of radiation using a mask having a mask critical dimension to form one or more first radiation-sensitive material portions, one or more second radiation-sensitive material portions, and one or more third radiation-sensitive material portions. The one or more first radiation-sensitive material portions may comprise first radiation-sensitive material portions subjected to high radiation exposure. The one or more second radiation-sensitive material portions may comprise second radiation-sensitive material portions subjected to low radiation exposure. The one or more third radiation-sensitive material portions may comprise third radiation-sensitive material portions subjected to intermediate radiation exposure characterized by a third critical dimension.

In 530, a temperature of the substrate is optionally elevated to a first post-exposure temperature. The thermal treatment process may comprise a first post-exposure bake (PEB), as described above. The first PEB may comprise setting the first post-exposure temperature, a time the substrate is elevated to the first post-exposure temperature, a heating rate for achieving the first post-exposure temperature, a cooling rate for reducing the first post-exposure temperature, a pressure of a gaseous environment surrounding the substrate during the elevation of the substrate to the first post-exposure temperature, or a composition of a gaseous environment surrounding the substrate during the elevation of the substrate to the first post-exposure temperature, or a combination of two or more thereof. The first post-exposure temperature may be ramped, or stepped.

In 540, the one or more first radiation-sensitive material portions are removed from the substrate using a first chemistry. The removal of the one or more first radiation-sensitive material portions may be characterized by a first critical dimension. The removal of the one or more first radiation-sensitive material portions may be performed using a first development process, such as a positive-tone development process or a negative-tone development process. The first development process may comprise setting a composition of the first chemistry, a time duration for the first development process, or a temperature for the first development process, or any combination of two or more thereof. The first chemistry may comprise a base solution. The first chemistry may further comprise a base solution, water, and an optional surfactant.

In 550, a temperature of the substrate is optionally elevated to a second post-exposure temperature. The thermal treatment process may comprise a second post-exposure bake (PEB). The second PEB may comprise setting the second post-exposure temperature, a time the substrate is elevated to the second post-exposure temperature, a heating rate for achieving the second post-exposure temperature, a cooling rate for reducing the second post-exposure temperature, a pressure of a gaseous environment surrounding the substrate during the elevation of the substrate to the second post-exposure temperature, or a composition of a gaseous environment surrounding the substrate during the elevation of the substrate to the second post-exposure temperature, or a combination of two or more thereof. The first post-exposure temperature may be ramped, or stepped.

In 560, the one or more second radiation-sensitive material portions are removed from the substrate using a second chemistry. The removal of the one or more second radiation-sensitive material portions may be characterized by a second critical dimension. The removal of the one or more second radiation-sensitive material portions may be performed using a second development process, such as a positive-tone development process or a negative-tone development process. The second development process may comprise setting a composition of the first chemistry, a time duration for the second development process, or a temperature for the second development process, or any combination of two or more thereof. The second chemistry may comprise an organic solvent. The second chemistry may further comprise an organic solvent, optionally water, and an optional surfactant.

In 570, the first critical dimension, the second critical dimension, and/or third critical dimension (corresponding to the critical dimension of the third radiation-sensitive material portions) are adjusted, controlled and/or optimized to meet pre-specified pattern requirements that may include a pre-specified first critical dimension, second critical dimension, and/or third critical dimension (corresponding to the critical dimension of the third radiation-sensitive material portions). This adjusting, controlling and/or optimizing include altering the patterning process. The adjusting, controlling, and/or optimizing is discussed in greater detail below.

The adjusting of the patterning process to achieve a target first critical dimension and/or second critical dimension, and/or a target critical dimension for the critical dimension of third radiation-sensitive material portions comprises performing one or more of the following: (1) adjusting an exposure dose for the exposing of the layer of radiation-sensitive material; (2) adjusting the mask critical dimension for the exposing of the layer of radiation-sensitive material; (3) adjusting the first post-exposure temperature, the time the substrate is elevated to the first post-exposure temperature, the heating rate for achieving the first post-exposure temperature, the cooling rate for reducing the first post-exposure temperature, the pressure of a gaseous environment surrounding the substrate during the elevation of the substrate to the first post-exposure temperature, or a composition of the gaseous environment surrounding the substrate during the elevation of the substrate to the first post-exposure temperature, or a combination of two or more thereof; (4) adjusting the second post-exposure temperature, the time the substrate is elevated to the second post-exposure temperature, the heating rate for achieving the second post-exposure temperature, the cooling rate for reducing the second post-exposure temperature, the pressure of a gaseous environment surrounding the substrate during the elevation of the substrate to the second post-exposure temperature, or a composition of the gaseous environment surrounding the substrate during the elevation of the substrate to the second post-exposure temperature, or a combination of two or more thereof; (5) adjusting the composition of the first chemistry, the time duration for applying the first chemistry, or a temperature of the first chemistry, or a combination of two or more thereof; or (6) adjusting the composition of the second chemistry, the time duration for applying the second chemistry, or a temperature for the second chemistry, or a combination of two or more thereof; or (7) performing a combination of two or more thereof.

Figure 6:
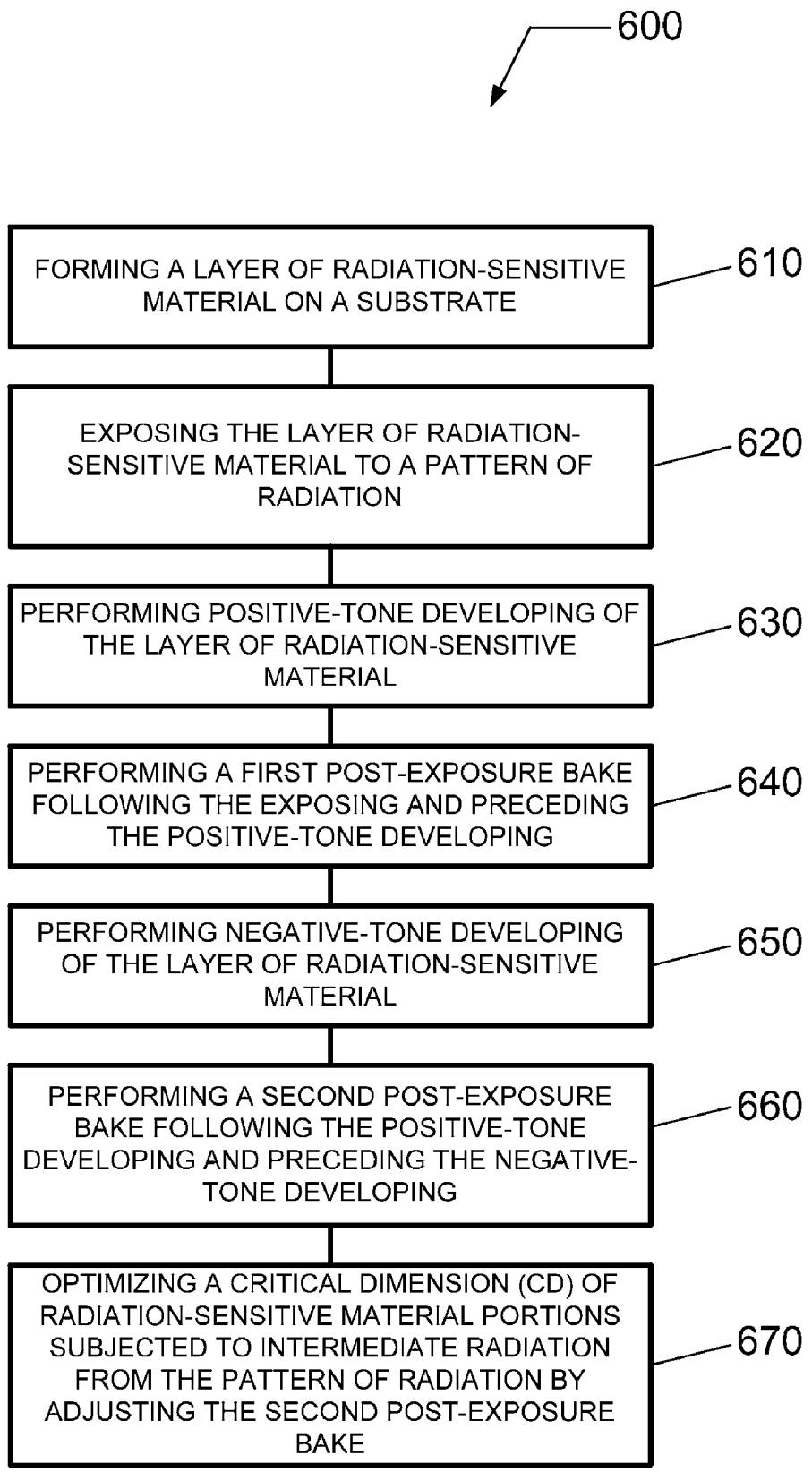
FIG. 6 illustrates a method of patterning a substrate.

Referring now to FIG. 6, a flow chart 600 of a method for double patterning a substrate is presented according to an embodiment. Flow chart 600 begins in 610 when a layer of radiation-sensitive material is formed on a substrate and, in 620, the layer of radiation-sensitive material is exposed to a pattern of radiation using a mask having a mask critical dimension to form first radiation-sensitive material portions having a high radiation exposure, second radiation-sensitive material portions having a low radiation exposure, and third radiation-sensitive material portions having an intermediate radiation exposure.

In 630, the first radiation-sensitive material portions are removed from the substrate by performing positive-tone developing of the layer of radiation-sensitive material from the substrate using a first chemistry. The removal of the first radiation-sensitive material portions may be characterized by a first critical dimension, or positive-tone critical dimension. The positive-tone development process may comprise setting a composition of the first chemistry, a time duration for the first development process, or a temperature for the first development process, or any combination of two or more thereof. The first chemistry may comprise a base solution. The first chemistry may further comprise a base solution, water, and an optional surfactant.

In 640, a temperature of the substrate is elevated to a first post-exposure temperature. The thermal treatment process may comprise a first post-exposure bake (PEB). The first PEB proceeds after the exposing and before the positive-tone developing of the layer of radiation-sensitive material. The first PEB may comprise setting the first post-exposure temperature, a time the substrate is elevated to the first post-exposure temperature, a heating rate for achieving the first post-exposure temperature, a cooling rate for reducing the first post-exposure temperature, a pressure of a gaseous environment surrounding the substrate during the elevation of the substrate to the first post-exposure temperature, or a composition of a gaseous environment surrounding the substrate during the elevation of the substrate to the first post-exposure temperature, or a combination of two or more thereof.

In 650, the second radiation-sensitive material portions are removed from the substrate by performing negative-tone developing of the layer of radiation-sensitive material from the substrate using a second chemistry. The removal of the second radiation-sensitive material portions may be characterized by a second critical dimension, or negative-tone critical dimension. The negative-tone development process may comprise setting a composition of the second chemistry, a time duration for the negative-tone development process, or a temperature for the negative-tone development process, or any combination of two or more thereof. The second chemistry may comprise an organic solvent. The second chemistry may further comprise an organic solvent, water, and an optional surfactant.

In 660, a temperature of the substrate is elevated to a second post-exposure temperature. The thermal treatment process may comprise a second post-exposure bake (PEB). The second PEB proceeds after the positive-tone developing of the layer of radiation-sensitive material and before the negative-tone developing of the layer of radiation-sensitive material. The second PEB may comprise setting the second post-exposure temperature, a time the substrate is elevated to the second post-exposure temperature, a heating rate for achieving the second post-exposure temperature, a cooling rate for reducing the second post-exposure temperature, a pressure of a gaseous environment surrounding the substrate during the elevation of the substrate to the second post-exposure temperature, or a composition of a gaseous environment surrounding the substrate during the elevation of the substrate to the second post-exposure temperature, or a combination of two or more thereof.

The features remaining on the substrate occupy regions related to the third radiation-sensitive material regions (subject to intermediate radiation exposure) may be characterized by a third critical dimension.

In 670, the third critical dimension is adjusted, controlled and/or optimized to meet pre-specified pattern requirements that may include a pre-specified third critical dimension. This adjusting, controlling and/or optimizing include altering the patterning process.

The adjusting of the patterning process to achieve a target third critical dimension comprises: the use of and the adjustment, control and/or optimization of the second post-exposure bake. The second PEB may be adjusted by: adjusting the second post-exposure temperature, the time the substrate is elevated to the second post-exposure temperature, the heating rate for achieving the second post-exposure temperature, the cooling rate for reducing the second post-exposure temperature, the pressure of a gaseous environment surrounding the substrate during the elevation of the substrate to the second post-exposure temperature, or a composition of the gaseous environment surrounding the substrate during the elevation of the substrate to the second post-exposure temperature, or a combination of two or more thereof.

According to one example, as will be illustrated below, the second critical dimension, or negative-tone critical dimension (associated with negative-tone developing) may be increased by the mere addition of the second thermal treatment step and the elevation of the substrate to the second post-exposure temperature for a period of time. In this example, following the exposure to the pattern of radiation, the substrate is elevated to the first post-exposure temperature, followed by positive-tone developing, followed by elevating the substrate to the second post-exposure temperature, followed by negative-tone developing. The second post-exposure temperature should be sufficiently high to cause chemical modification of the layer of radiation-sensitive material remaining on the substrate prior to negative-tone developing. Additionally, an increase in the second post-exposure temperature may cause a further increase in the second critical dimension. When holding the first critical dimension or positive-tone critical dimension approximately constant, the third critical dimension may also be increased with the second PEB and an increase in the second post-exposure temperature.

According to another example, the first critical dimension, or positive-tone critical dimension (associated with positive-tone developing) may be increased by the addition of the second thermal treatment step and the elevation of the substrate to the second post-exposure temperature for a period of time. In this example, following the exposure to the pattern of radiation, the substrate is elevated to the first post-exposure temperature, followed by negative-tone developing, followed by elevating the substrate to the second post-exposure temperature, followed by positive-tone developing. The second post-exposure temperature should be sufficiently high to cause chemical modification of the layer of radiation-sensitive material remaining on the substrate prior to positive-tone developing. Additionally, an increase in the second post-exposure temperature may cause a further increase in the first critical dimension. When holding the second critical dimension or negative-tone critical dimension approximately constant, the third critical dimension may also be decreased with the second PEB and an increase in the second post-exposure temperature.

Figure 7:
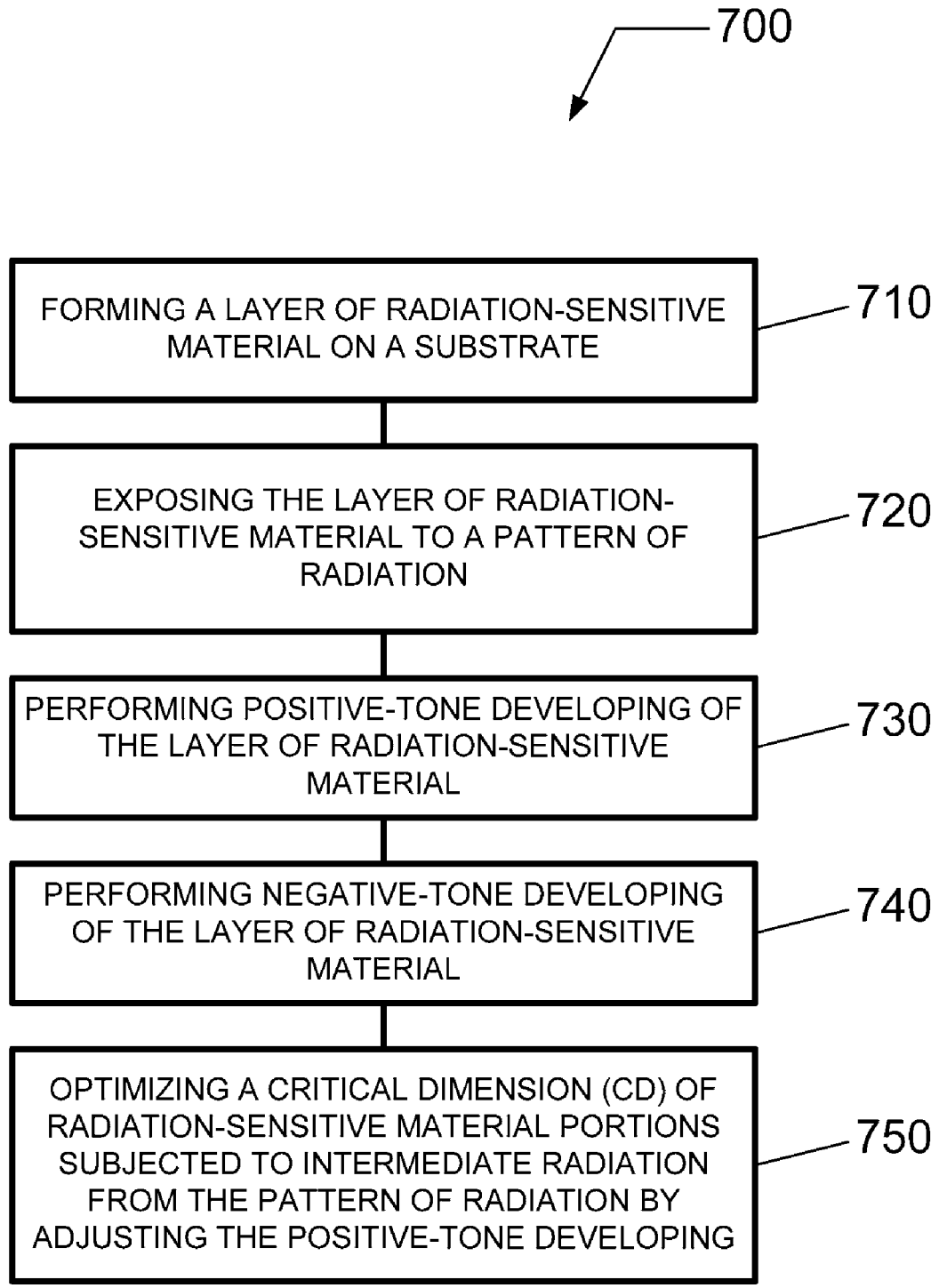
FIG. 7 illustrates a method of patterning a substrate.

Referring now to FIG. 7, a flow chart 700 of a method for double patterning a substrate is presented according to an embodiment. Flow chart 700 begins in 710 when a layer of radiation-sensitive material is formed on a substrate and, in 720, the layer of radiation-sensitive material is exposed to a pattern of radiation using a mask having a mask critical dimension to form first radiation-sensitive material portions having a high radiation exposure, second radiation-sensitive material portions having a low radiation exposure, and third radiation-sensitive material portions having an intermediate radiation exposure.

In 730, the first radiation-sensitive material portions are removed from the substrate by performing positive-tone developing of the layer of radiation-sensitive material from the substrate using a first chemistry. The removal of the first radiation-sensitive material portions may be characterized by a first critical dimension, or positive-tone critical dimension. The positive-tone development process may comprise setting a composition of the first chemistry, a time duration for the first development process, or a temperature for the first development process, or any combination of two or more thereof. The first chemistry may comprise a base solution. The first chemistry may further comprise a base solution, water, and an optional surfactant.

Optionally, a temperature of the substrate is elevated to a first post-exposure temperature. The thermal treatment process may comprise a first post-exposure bake (PEB). The first PEB proceeds after the exposing and before the positive-tone developing of the layer of radiation-sensitive material. The first PEB may comprise setting the first post-exposure temperature, a time the substrate is elevated to the first post-exposure temperature, a heating rate for achieving the first post-exposure temperature, a cooling rate for reducing the first post-exposure temperature, a pressure of a gaseous environment surrounding the substrate during the elevation of the substrate to the first post-exposure temperature, or a composition of a gaseous environment surrounding the substrate during the elevation of the substrate to the first post-exposure temperature, or a combination of two or more thereof.

In 740, the second radiation-sensitive material portions are removed from the substrate by performing negative-tone developing of the layer of radiation-sensitive material from the substrate using a second chemistry. The removal of the second radiation-sensitive material portions may be characterized by a second critical dimension, or negative-tone critical dimension. The negative-tone development process may comprise setting a composition of the second chemistry, a time duration for the negative-tone development process, or a temperature for the negative-tone development process, or any combination of two or more thereof. The second chemistry may comprise an organic solvent. The second chemistry may further comprise an organic solvent, water, and an optional surfactant.

Optionally, a temperature of the substrate is elevated to a second post-exposure temperature. The thermal treatment process may comprise a second post-exposure bake (PEB). The second PEB proceeds after the positive-tone developing of the layer of radiation-sensitive material and before the negative-tone developing of the layer of radiation-sensitive material. The second PEB may comprise setting the second post-exposure temperature, a time the substrate is elevated to the second post-exposure temperature, a heating rate for achieving the second post-exposure temperature, a cooling rate for reducing the second post-exposure temperature, a pressure of a gaseous environment surrounding the substrate during the elevation of the substrate to the second post-exposure temperature, or a composition of a gaseous environment surrounding the substrate during the elevation of the substrate to the second post-exposure temperature, or a combination of two or more thereof.

The features remaining on the substrate occupy regions related to the third radiation-sensitive material regions (subject to intermediate radiation exposure) may be characterized by a third critical dimension.

In 750, the third critical dimension is adjusted, controlled and/or optimized to meet pre-specified pattern requirements that may include a pre-specified third critical dimension. This adjusting, controlling and/or optimizing include altering the patterning process.

The adjusting of the patterning process to achieve a target third critical dimension comprises: the adjustment, control and/or optimization of the positive-tone developing. The positive-tone developing may be adjusted by: adjusting the composition of the first chemistry, the time duration for applying the first chemistry, or a temperature of the first chemistry, or a combination of two or more thereof.

According to one example, as will be illustrated below, the first critical dimension, or positive-tone critical dimension (associated with positive-tone developing) may be decreased by an adjustment of the composition of the first chemistry. When the first chemistry comprises a base with water and an optional surfactant, the dilution of the base in the solution may cause a decrease in the first critical dimension. When holding the second critical dimension or negative-tone critical dimension approximately constant, the third critical dimension may also be increased with the dilution of the positive-tone developing solution.

Figure 8:
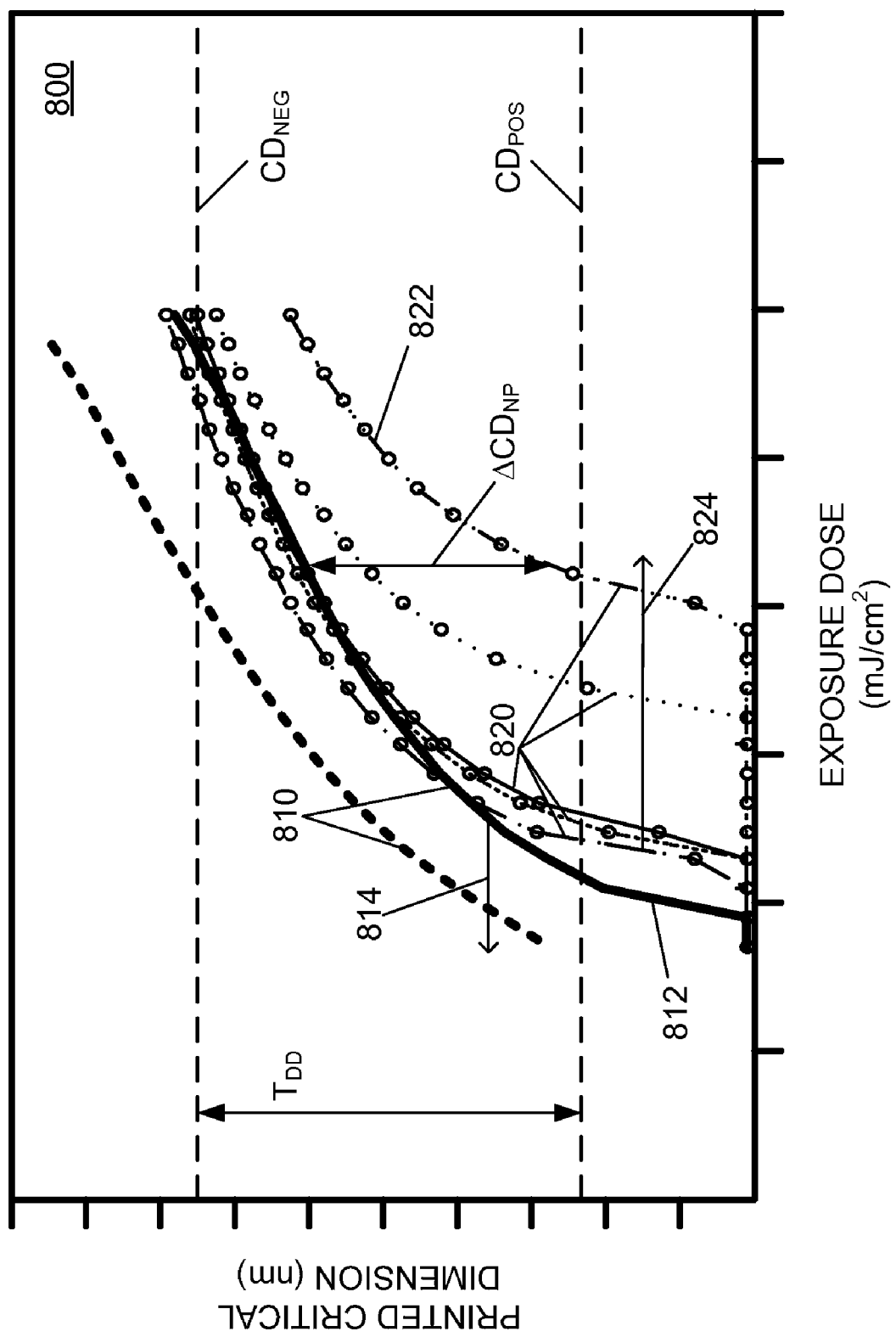
FIG. 8 presents exemplary data for patterning a substrate.

Referring now to FIG. 8, exemplary data 800 is provided for a dual-tone double patterning process. As illustrated in FIG. 8, the printed critical dimension (nm, nanometers) is provided as a function of exposure dose ($mJ/cm^2$, milli-Joules per square centimeters) for a set of negative-tone development characteristics 810 and a set of positive-tone development characteristics 820. The set of negative-tone development characteristics 810 and the set of positive-tone development characteristics 820 may be acquired using numerical simulation, experiment, or a combination thereof.

A characteristic defines a relationship between a critical dimension and a control parameter, such as an exposure dose; however, other control parameters may be used. The characteristic is determined by setting a set of process parameters for performing the dual-tone patterning process, such as the processes described in FIGS. 3, 4A-4D, 5, 6, and 7, wherein the set of process parameters includes any one or more of the process parameters described above with respect to these processes. While holding these process parameters constant, a critical dimension is measured and/or computed as the control parameter is varied. This procedure for preparing a characteristic may be used to determine one or more negative-tone characteristics and/or one or more positive-tone characteristics. The characteristics may be prepared using a negative-tone pattern development process, a positive-tone pattern development process, or a dual-tone pattern development process.

The set of negative-tone development characteristics 810 exhibit a variation in one or more parameters useful in adjusting or controlling the negative-tone critical dimension. For example, the one or more parameters may include any parameter, as described above, for performing a second post-exposure bake following the positive-tone development. Additionally, for example, the one or more parameters may include any parameter for performing the negative-tone development.

Figure 9:
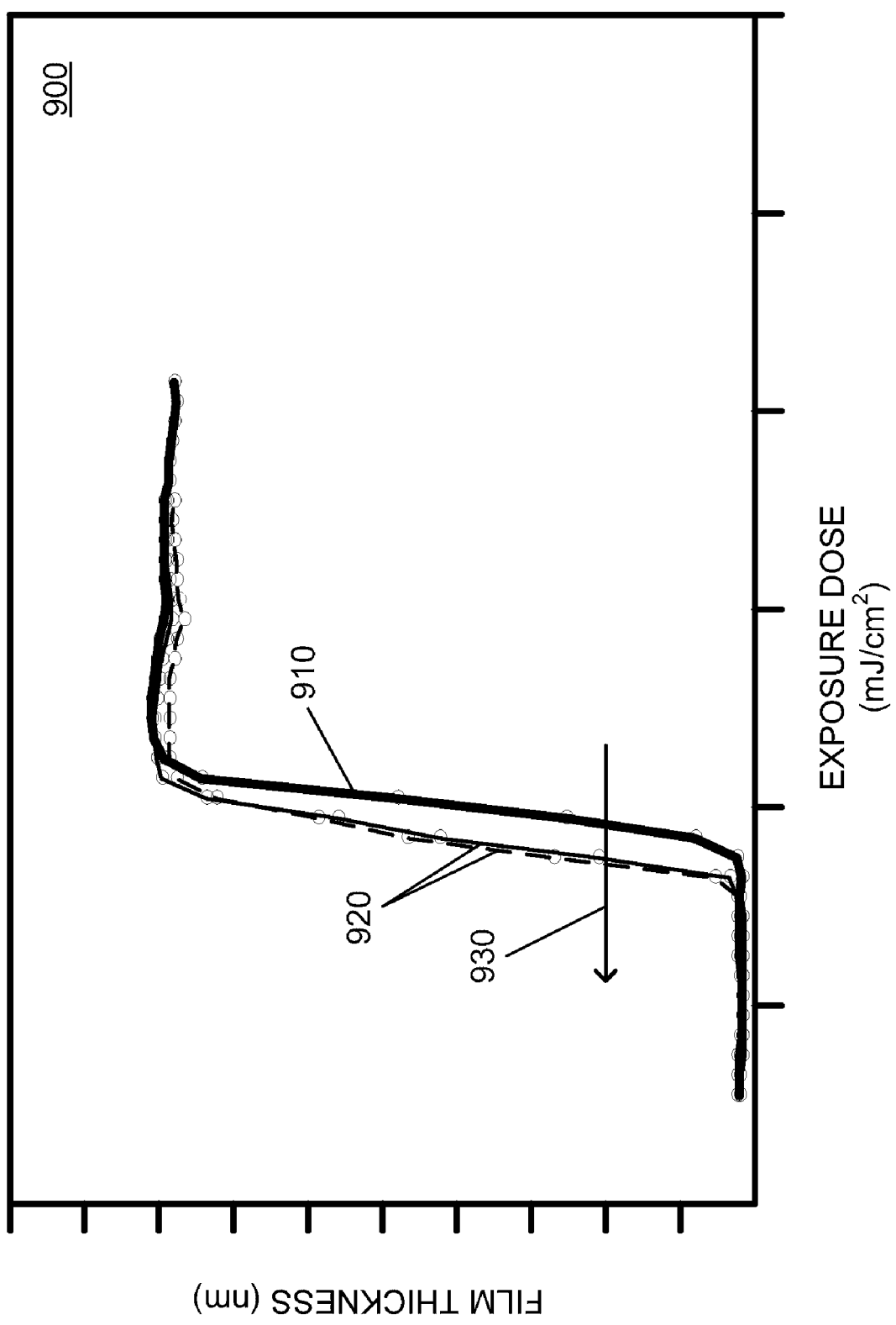
FIG. 9 presents exemplary data for patterning a substrate.

As shown in FIG. 9, a film thickness (nm) (or normalized film thickness) for a layer of radiation-sensitive material following negative-tone development is shown as a function of exposure dose (mJ/cm$^2$). A first contrast curve 910 in the exemplary data 900 is presented wherein the second post-exposure bake following positive-tone development is not performed. A second set of curves 920 are also presented wherein the second post-exposure bake following positive-tone development is performed. As depicted in FIG. 9, the contrast curves shift to lower exposure dose (indicated by arrow 930) indicating a decrease in the lower solubility threshold or a resulting increase in the negative-tone critical dimension. The shift to lower exposure dose of the negative contrast curves may be achieved by increasing the second post-exposure temperature and/or the time duration for elevation at the second post-exposure temperature (see trend 814 in FIG. 8).

In FIG. 8, the set of positive-tone development characteristics 820 exhibit a variation in one or more parameters useful in adjusting or controlling the positive-tone critical dimension. For example, the one or more parameters may include any parameter, as described above, for performing a second post-exposure bake following the positive-tone development. Additionally, for example, the one or more parameters may include any parameter for performing the positive-tone development.

Figure 10:
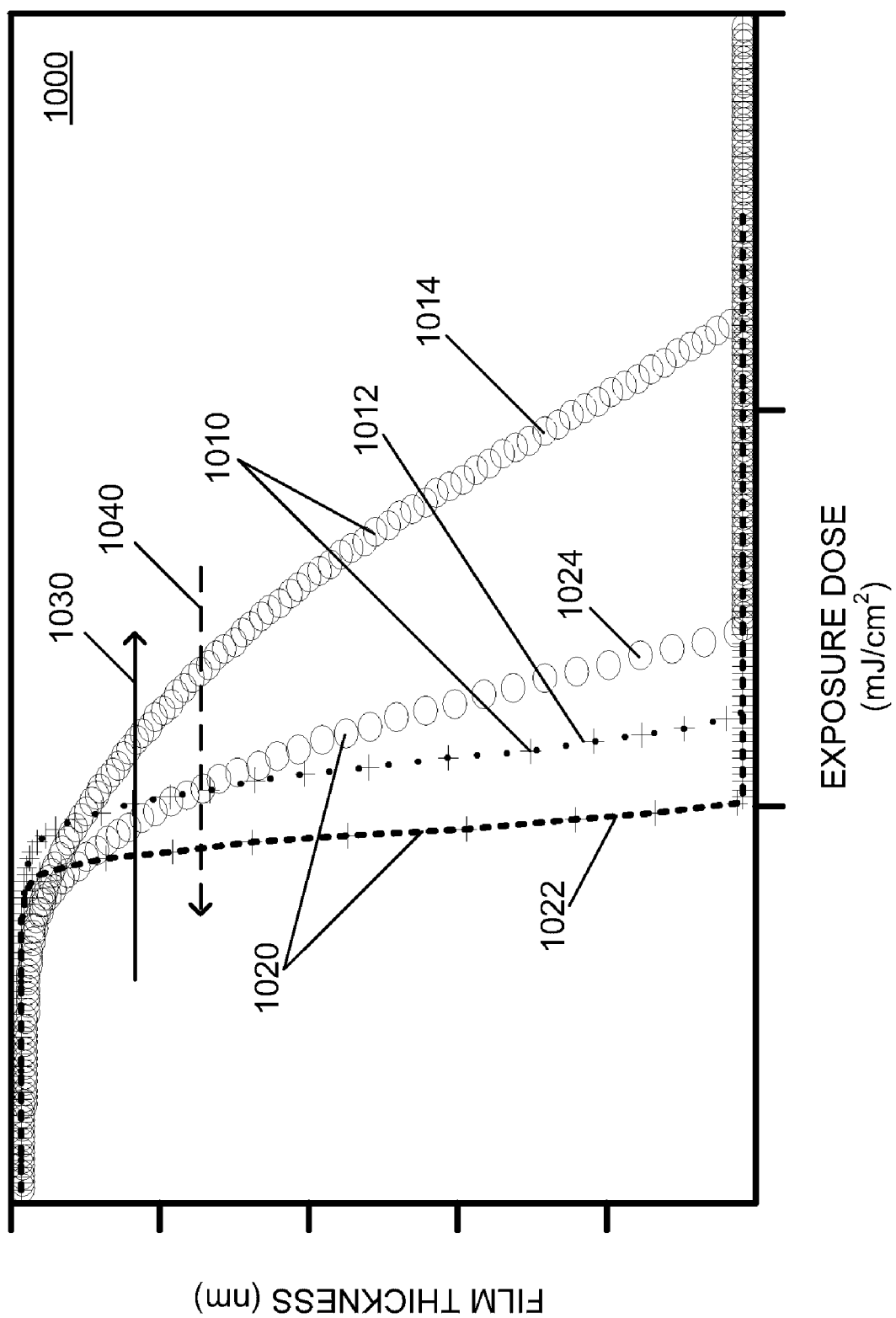
FIG. 10 presents additional exemplary data for patterning a substrate.

As shown in FIG. 10, a film thickness (nm) (or normalized film thickness) for a layer of radiation-sensitive material following positive-tone development is shown as a function of exposure dose (mJ/cm$^2$). A first set of positive contrast curves 1010 in exemplary data 1000 is provided having a first contrast curve 1012 and a second contrast curve 1014. The first contrast curve 1012 is acquired when the second post-exposure bake following positive-tone development is not performed. The second contrast curve 1014 is acquired when the second post-exposure bake following positive-tone development is not performed and the positive-tone development solution (e.g., first chemistry having a base, water, and optional surfactant) is diluted relative to the first contrast curve 1012. As depicted in FIG. 10, the contrast curves shift to higher exposure dose (indicated by arrow 1030) indicating an increase in the upper solubility threshold or a resulting decrease in the positive-tone critical dimension. The shift to higher exposure dose of the positive contrast curves may be achieved by increasing the dilution of the positive-tone development chemistry (see trend 824 in FIG. 8).

A second set of curves 1020 is provided having a third contrast curve 1022 and a fourth contrast curve 1024. The third contrast curve 1022 is acquired when the second post-exposure bake following positive-tone development is performed and the positive-tone development solution is the same for the first contrast curve 1012. As depicted in FIG. 10, the contrast curves shift to lower exposure dose (indicated by arrow 1040) indicating a decrease in the upper solubility threshold or a resulting increase in the positive-tone critical dimension. The shift to lower exposure dose of the positive contrast curves may be achieved by increasing the second post-exposure temperature and/or the time duration for elevation at the second post-exposure temperature.

The fourth contrast curve 1024 is acquired when the second post-exposure bake following positive-tone development is performed and the positive-tone development solution is diluted relative to the first contrast curve 1012. As depicted in FIG. 10, the contrast curves shift to higher exposure dose (indicated by arrow 1030) indicating an increase in the upper solubility threshold or a resulting decrease in the positive-tone critical dimension.

Figure 11:
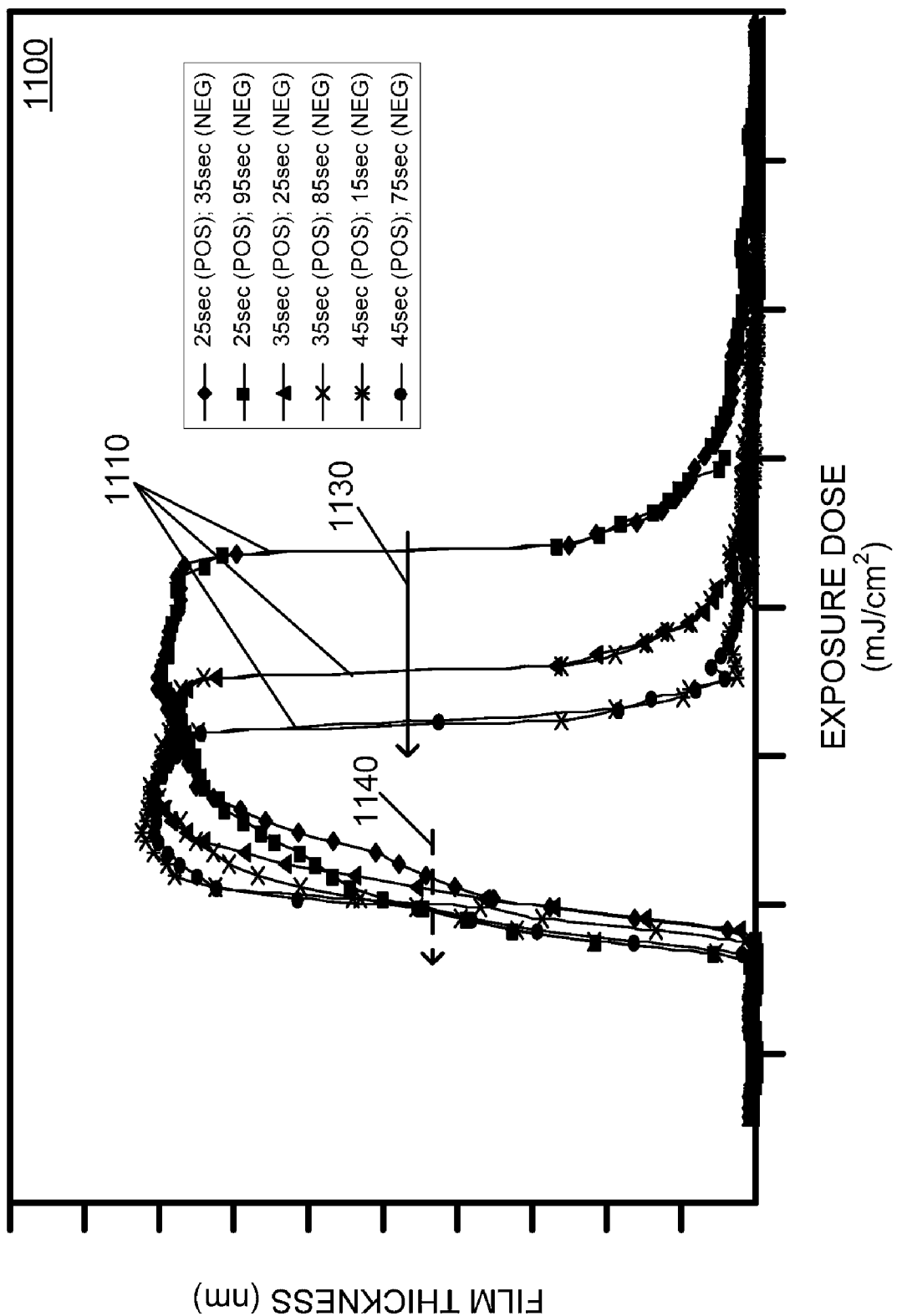
FIG. 11 presents additional exemplary data for patterning a substrate.

As shown in FIG. 11, a film thickness (nm) (or normalized film thickness) for a layer of radiation-sensitive material following negative-tone development is shown as a function of exposure dose (mJ/cm$^2$). Following the exposure of the layer of radiation-sensitive material to a pattern of radiation, the layer of radiation-sensitive material undergoes a first post-exposure bake for a first time duration followed by positive-tone development, and then undergoes a second post-exposure bake for a second time duration followed by negative-tone development. A family of contrast curves 1110 in the exemplary data 1100 is presented, wherein the first time duration for the first post-exposure bake (e.g., the first time duration is indicated in the legend by the time preceding "POS") and the second time duration for the second post-exposure bake (e.g., the second time duration is indicated in the legend by the time preceding "NEG") are varied.

As illustrated in FIG. 11, when the first time duration for the first post-exposure bake (preceding the positive-tone development) is held constant (i.e., at 25 sec (seconds), 35 sec, and 45 sec) while the second time duration for the second post-exposure bake (preceding the negative-tone development) is increased (i.e., 35 sec to 95 sec, 25 sec to 85 sec, and 15 sec to 75 sec), the lower exposure threshold shifts to the left (i.e., the lower exposure threshold decreases) (trend indicated by arrow 1140). The decrease in the lower exposure threshold manifests as an increase in the second critical dimension or negative-tone critical dimension. Furthermore, while the lower exposure threshold is decreased by increasing the second time duration during the second post-exposure bake, the upper exposure threshold remains substantially constant when the first time duration is held constant.

Additionally, as illustrated in FIG. 11, when the second time duration for the second post-exposure bake (preceding the negative-tone development) is held approximately constant with a slight variation (i.e., at 35 sec, 25 sec, and 15 sec; and at 95 sec, 85 sec, and 75 sec) while the first time duration for the first post-exposure bake (preceding the positive-tone development) is increased (i.e., 35 sec to 35 sec to 45 sec), the upper exposure threshold shifts to the left (i.e., the upper exposure threshold decreases) (trend indicated by arrow 1130). The decrease in the upper exposure threshold manifests as an increase in the first critical dimension or positive-tone critical dimension. Furthermore, while the upper exposure threshold is decreased by increasing the first time duration during the first post-exposure bake, the lower exposure threshold remains approximately constant when the second time duration is held approximately constant.

Referring again to FIG. 8, when printing a pattern of features on a substrate, a target positive-tone critical dimension ($CD_{POS}$) and a target negative-tone critical dimension ($CD_{NEG}$) may be selected or specified. Thereafter, a target difference ($T_{DD}$) between the target positive-tone critical dimension and the target negative-tone critical dimension may be computed for the double development metric. Alternatively, two or more of the target difference, the target positive-tone critical dimension and the target negative-tone critical dimension may be specified, while the third is computed.

Through inspection of the set of negative-tone development characteristics 810 and the set of positive-tone development characteristics 820, a target negative-tone characteristic 812 may be selected and a target positive-tone characteristic 822 may be selected that possesses a $\Delta CD_{NP}$ comparable to $T_{DD}$. Desirably, the selected characteristics possess a $\Delta CD_{NP}$ that is greater than $T_{DD}$.

The dual-tone double patterning process may be optimized by selecting the target negative-tone characteristic and the target positive-tone characteristic such that the target positive-tone characteristic intersects the target positive-tone critical dimension at a given exposure dose and the target negative-tone characteristic intersects the target negative-tone critical dimension at the same given exposure dose.

Alternatively, the dual-tone double patterning process may be optimized by selecting the target positive-tone characteristic such that the target positive-tone characteristic intersects the target positive-tone critical dimension at a given exposure dose. Then, the target negative-tone characteristic may be selected when $\Delta CD_{NP}$ is approximately comparable to $T_{DD}$ for the given exposure dose. Alternatively yet, the target negative-tone characteristic may be selected when DDM is approximately unity, where:

$$DDM=1-([|\Delta CD_{NP}|-T_{DD}]/T_{DD}), \quad (3)$$

Figure 12:
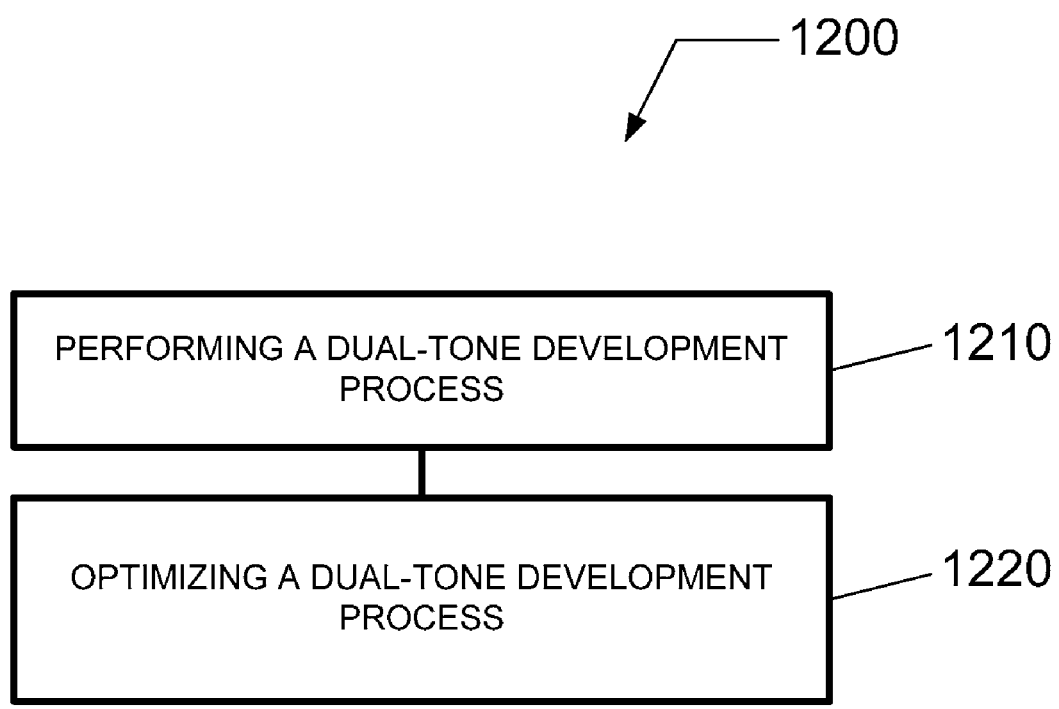
FIG. 12 illustrates a method of patterning a substrate.

Referring now to FIG. 12, a flow chart 1200 of a method for optimizing a double patterning process is presented according to an embodiment. Flow chart 1200 begins in 1210 with performing a dual-tone development process. The dual-tone development process comprises: exposing a layer of radiation-sensitive material to a pattern of radiation, performing a positive-tone development process to remove a first radiation-sensitive material portion characterized by a positive-tone critical dimension, and performing a negative-tone development process to remove a second radiation-sensitive material portion characterized by a negative-tone critical dimension.

In 1220, the dual-tone development process is optimized to achieve a target difference between a target positive-tone critical dimension and a target negative-tone critical dimension. The optimization of the dual-tone development process comprises: acquiring one or more positive-tone characteristics, wherein the one or more positive-tone characteristics relate the positive-tone critical dimension to a control parameter for a first set of process parameters; acquiring one or more negative-tone characteristics, wherein the one or more negative-tone characteristics relate the negative-tone critical dimension to the control parameter for a second set of process parameters; selecting a target positive-tone characteristic from the one or more positive-tone characteristics that approximately intersects the target positive-tone critical dimension at a target control parameter to within a first deviation; selecting a target negative-tone characteristic from the one or more negative-tone characteristics that approximately intersects the target negative-tone critical dimension at the target control parameter to within a second deviation; and establishing a process recipe for the performing the dual-tone development process using the target positive-tone characteristic, the target negative-tone characteristic, and the target control parameter.

The first deviation and the second deviation may be selected to be an absolute value, such as plus or minus 5 nm, plus or minus 2 nm. Alternatively, first deviation and the second deviation may be selected to be an relative value, such as plus or minus 10% of $T_{DD}$, plus or minus 5% of $T_{DD}$.

Figure 13A:
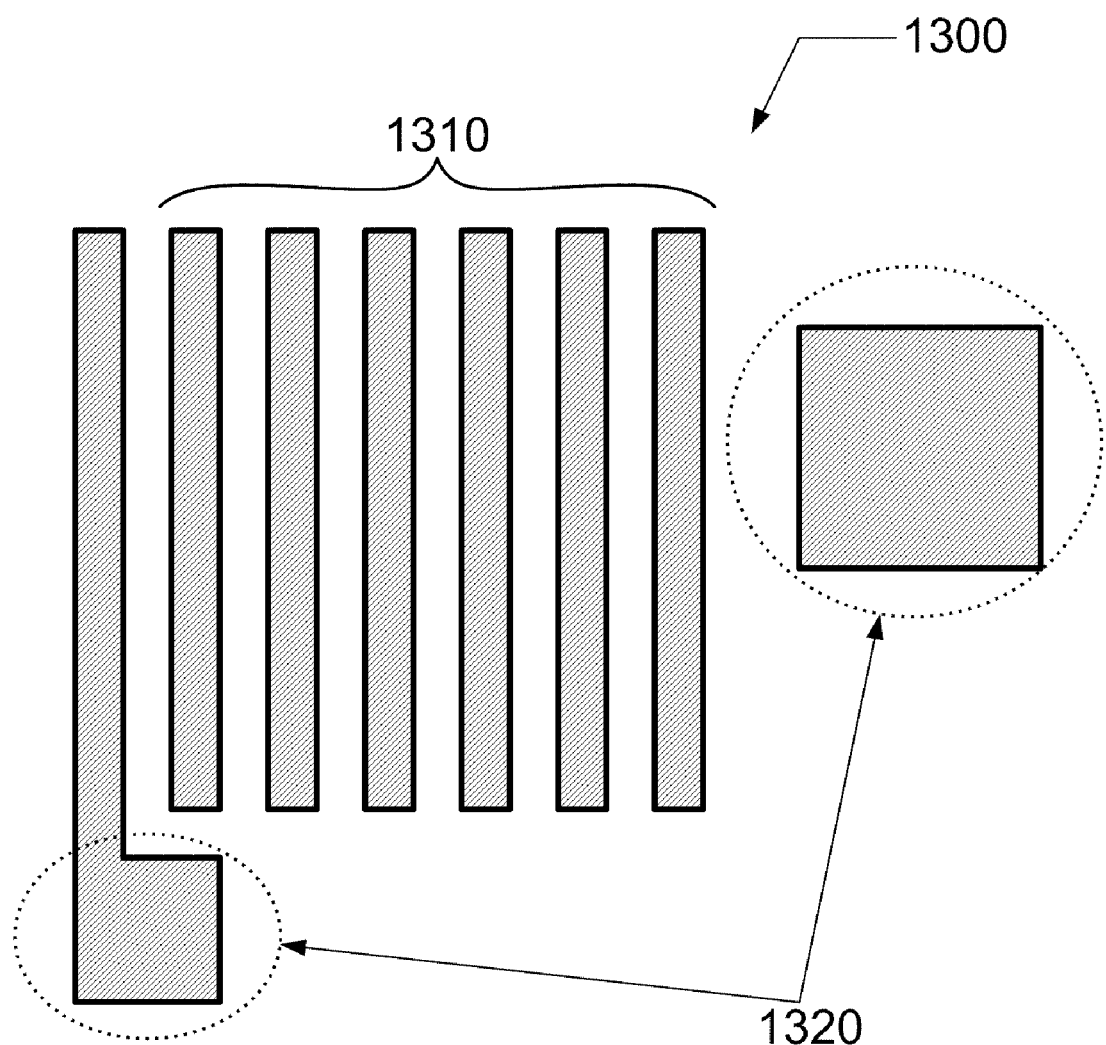
FIGS. 13A through 13D illustrate a method of patterning a substrate.

Referring now to FIGS. 13A through 13D, a method of patterning a substrate is illustrated. As shown in FIG. 13A, a layout 1300 of features having various sizes and shapes is illustrated. The layout 1300 comprises critical areas 1310, including finer features requiring more stringent lithographic printing tolerances such as minimum pitch features, gate structures, etc., and less critical areas 1320, including larger features (relative to minimum dimension features) requiring less stringent lithographic printing tolerances such as landing pads, border features, label characters, etc. For example, as shown in FIG. 13A, the critical areas 1310 may include an array of minimum pitch lines, whereas the less critical areas 1320 may include the square feature at the base of a line and the larger square feature off to the right of the array of minimum pitch lines.

Figure 13B:
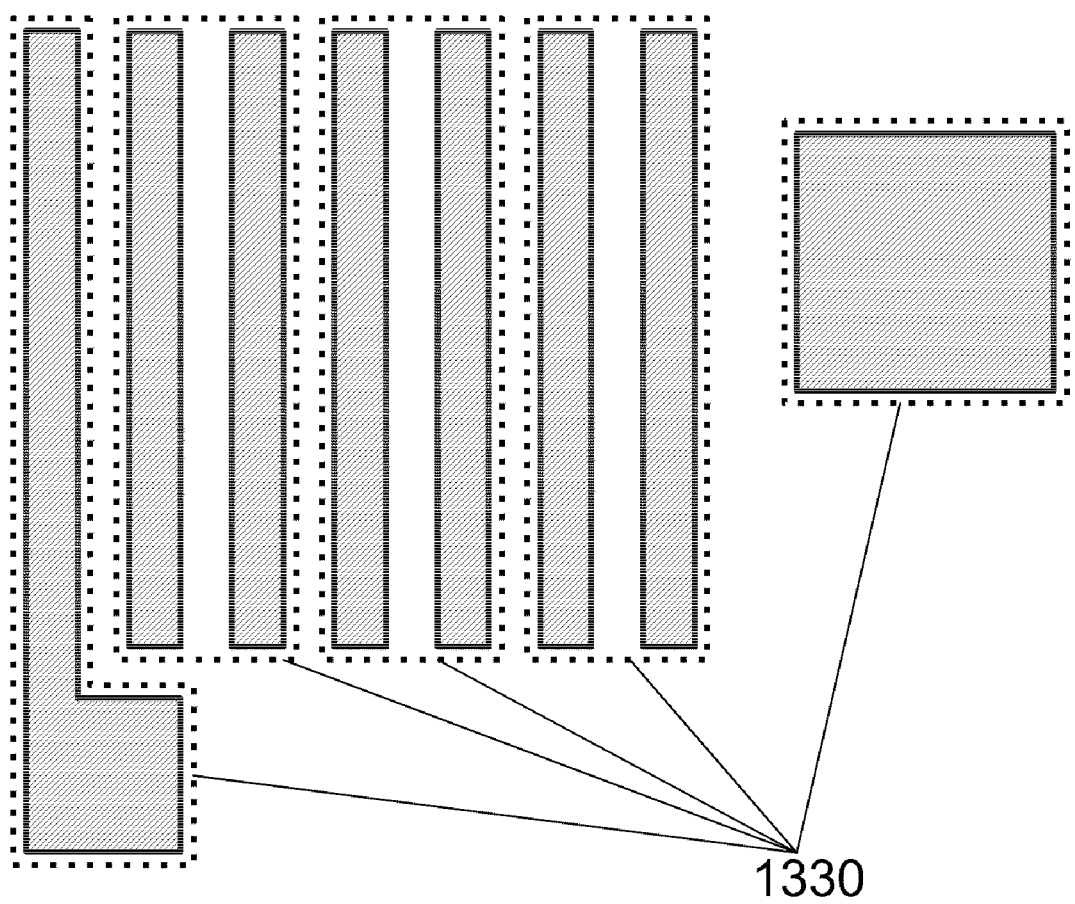
Figure 13C:
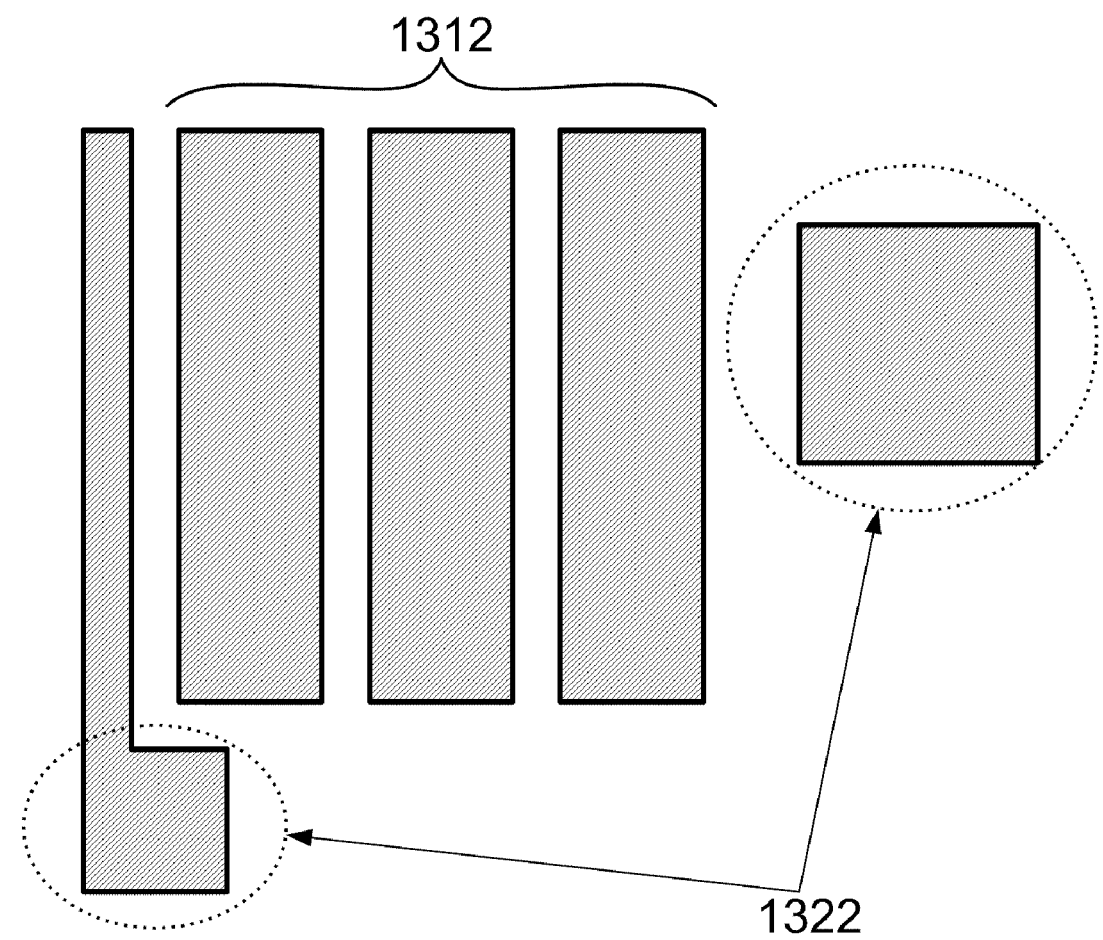

In FIG. 13B, the substrate having a layer of radiation-sensitive material is exposed to electro-magnetic (EM) radiation though a mask having opaque regions 1330. Following the exposure, an optional post-exposure bake, and positive-tone developing, a first array of features, including critical area 1312 and less critical area 1322, remain in the layer of radiation-sensitive material as shown in FIG. 13C.

Figure 13D:
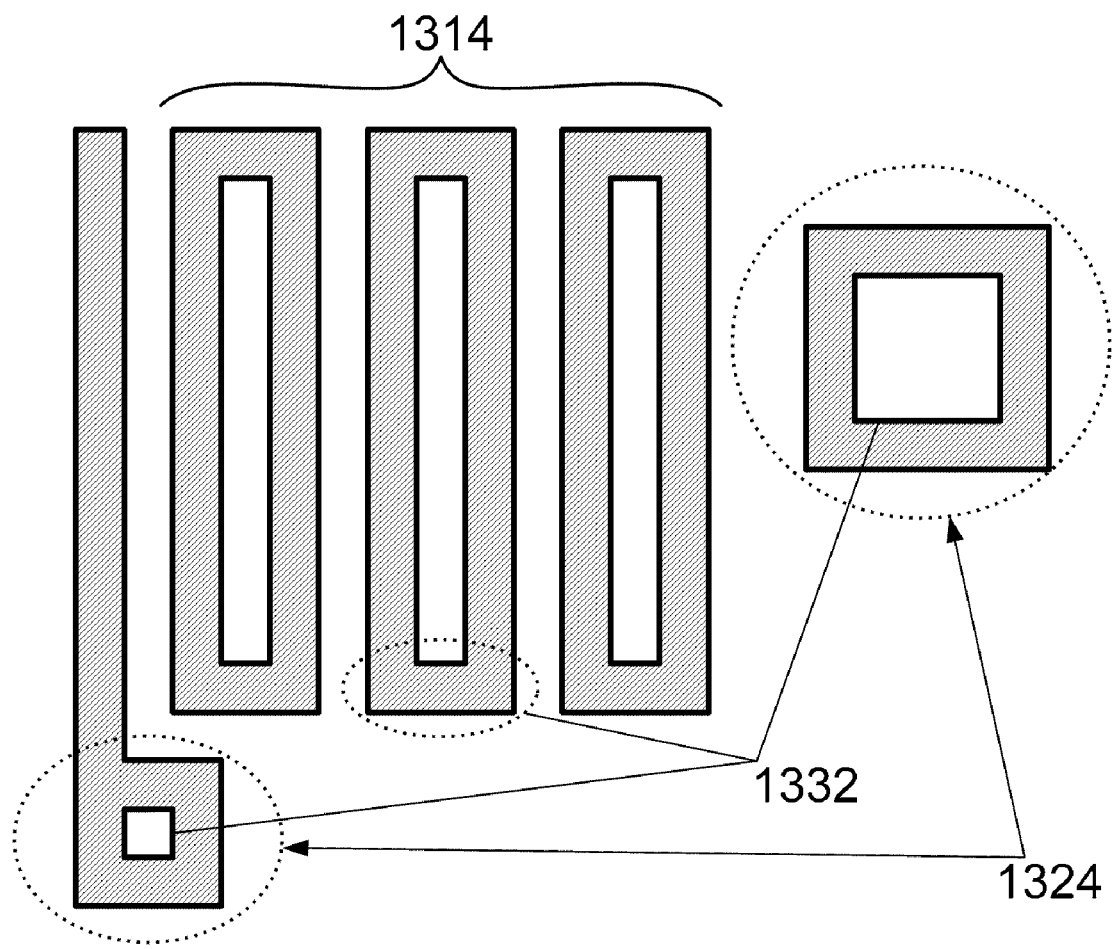

Thereafter, in FIG. 13D, the substrate with the first array of features proceeds through an optional second post-exposure bake and negative-tone developing. As a result, a second array of features, including critical area 1314 and less critical area 1324, remain in the layer of radiation-sensitive material as shown in FIG. 13D. However, pattern defects 1332 in the printed patterns, including an interconnection of the ends of the array of minimum pitch lines, a void in the square feature at the base of the first line and a void in the larger square feature off to the right of the array of minimum pitch lines, are observed as a consequence of the dual-tone development process. Therefore, a methodology for printing critical areas and non-critical areas, including areas having some level of criticality, is required for a successful implementation of a dual-tone development process.

Figure 14A:
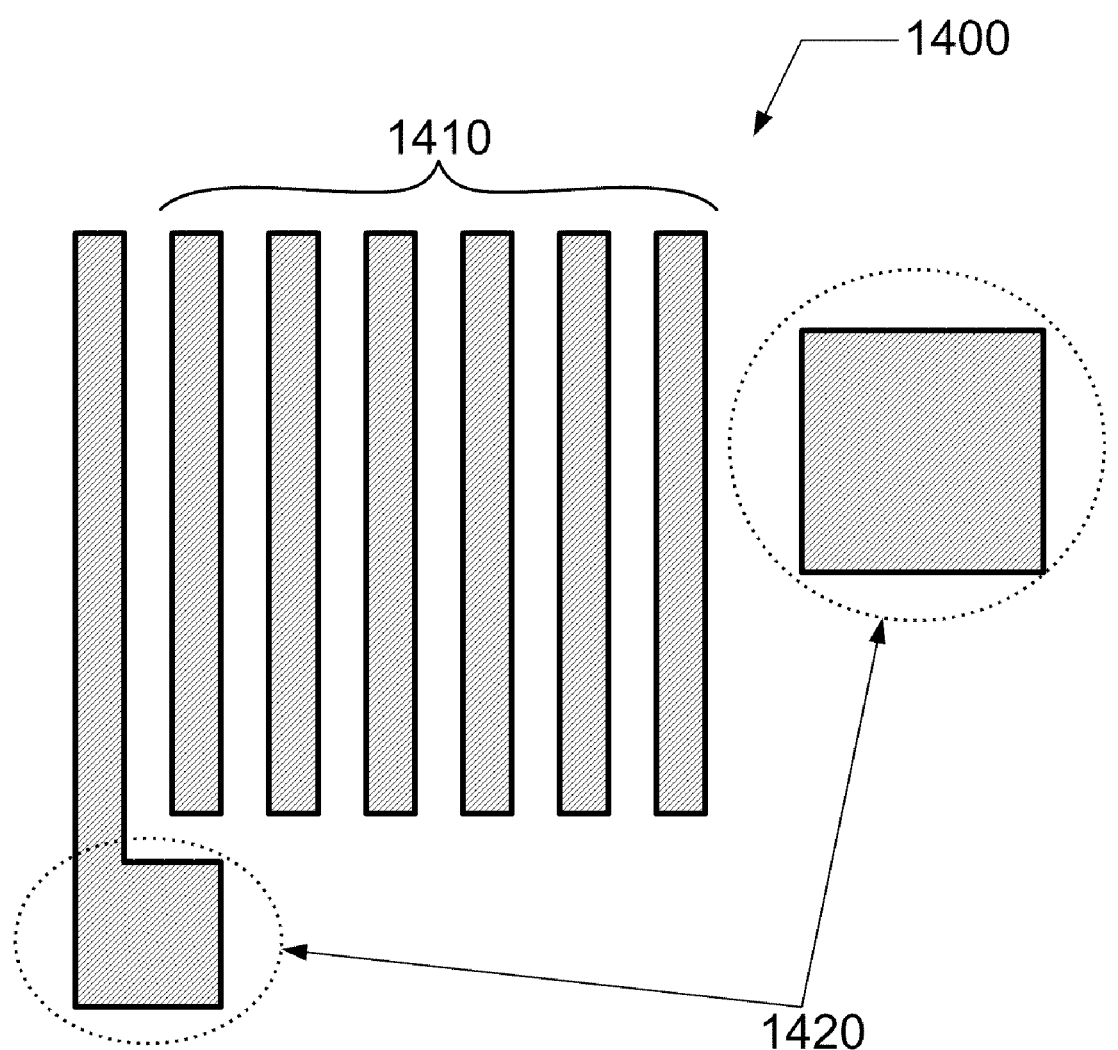
FIGS. 14A through 14F illustrate a method of patterning a substrate according to an embodiment.

Referring now to FIGS. 14A through 14F, a method of patterning a substrate is illustrated according to an embodiment. As shown in FIG. 14A, a layout 1400 of features having various sizes and shapes is illustrated. The layout 1400 comprises critical areas 1410, including finer features requiring more stringent lithographic printing tolerances such as minimum pitch features, gate structures, etc., and less critical areas 1420, including larger features (relative to minimum dimension features) requiring less stringent lithographic printing tolerances such as landing pads, border features, label characters, etc. For example, as shown in FIG. 14A, the critical areas 1410 may include an array of minimum pitch lines, whereas the less critical areas 1420 may include the square feature at the base of a line and the larger square feature off to the right of the array of minimum pitch lines.

Figure 14B:
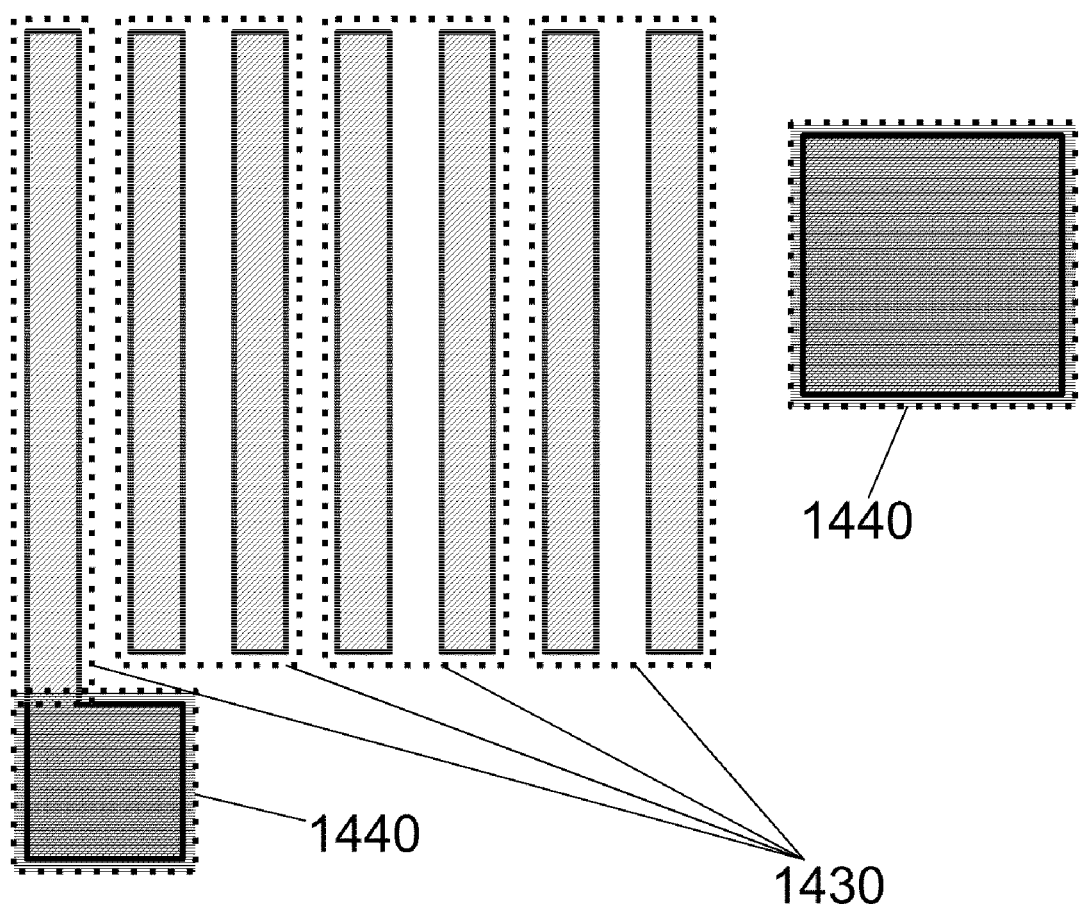

In FIG. 14B, the substrate having a layer of radiation-sensitive material is exposed to electro-magnetic (EM) radiation though a mask having a dual-tone mask pattern region 1430 associated with the critical area 1410 and a half-tone mask pattern region 1440 associated with the less critical area 1420. The dual-tone mask pattern region 1430 facilitates printing the finely spaced lines in the critical area 1410 via double patterning with the dual-tone development process as described above. The half-tone mask pattern region 1440 facilitates printing gray-scale features in the less critical area 1420 without pattern defects. The gray-scaling of features is achieved by setting the localized mask transmission of geometries of interest, i.e., the half-tone mask pattern region 1440, to an image intensity level that results in an adequate level of de-protection in the exposed layer of radiation-sensitive material.

Figure 14C:
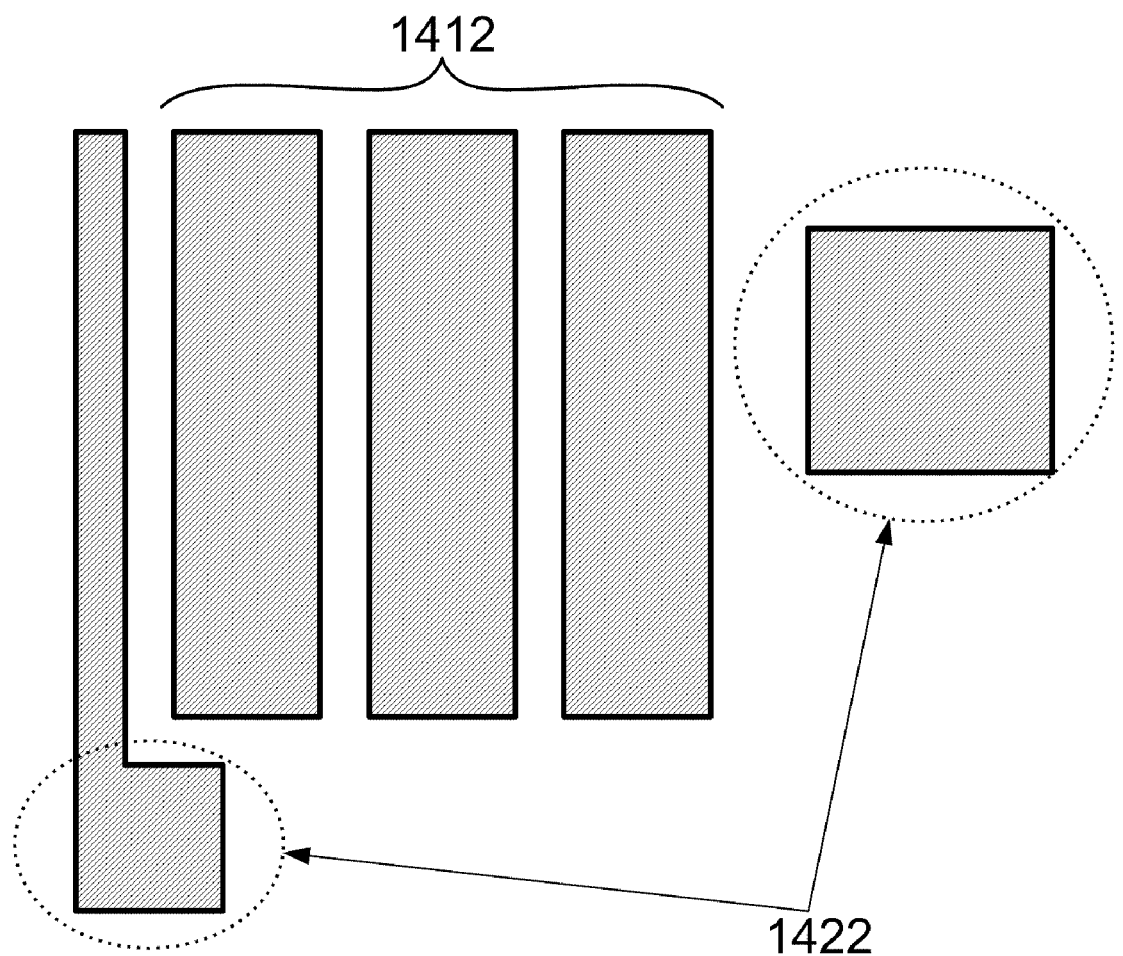
Figure 14D:
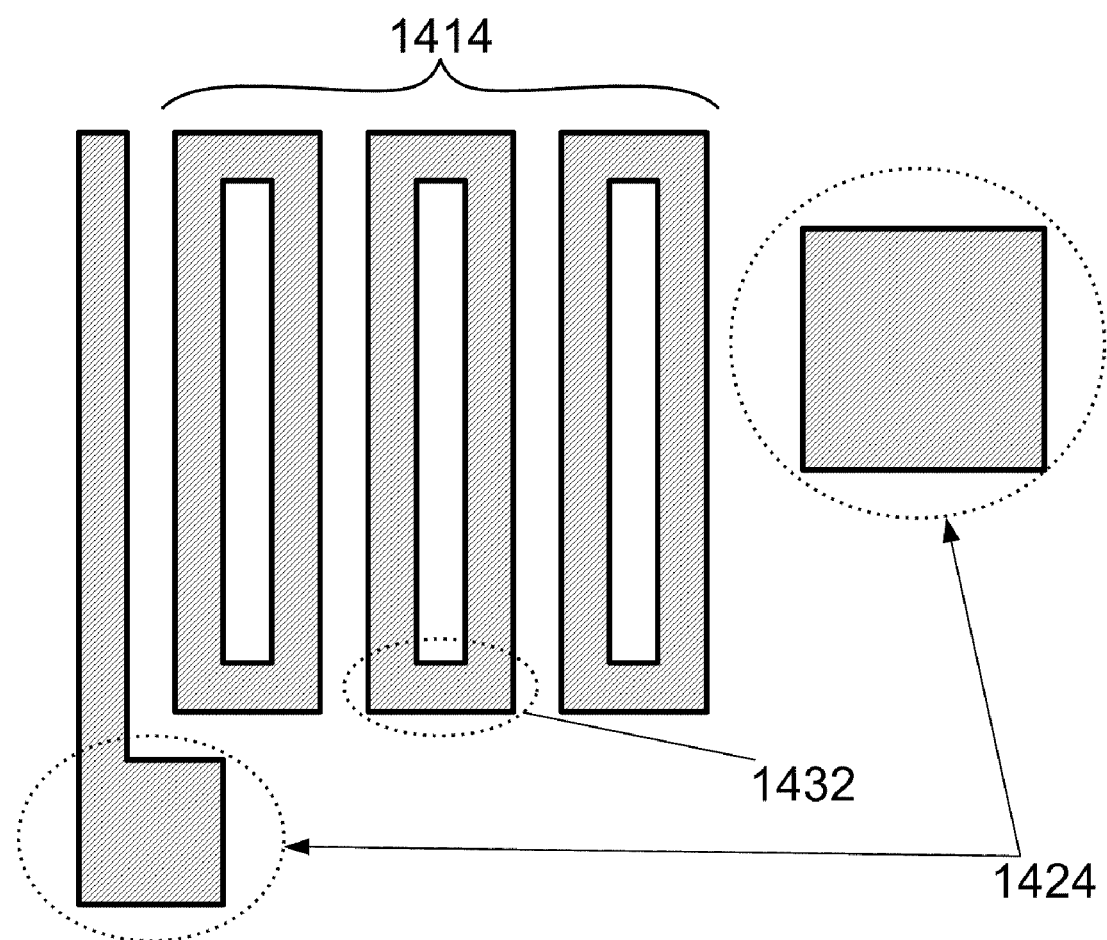

Following the exposure, an optional post-exposure bake, and positive-tone developing, a first array of features, including critical area 1412 and non-critical area 1422, remain in the layer of radiation-sensitive material as shown in FIG. 14C. Thereafter, in FIG. 14D, the substrate with the first array of features proceeds through an optional second post-exposure bake and negative-tone developing. As a result, a second array of features, including critical area 1414 and less critical area 1424, remain in the layer of radiation-sensitive material as shown in FIG. 14D. The level of de-protection of the gray-scale features in the less critical area 1424 is such that the entire geometry remains following positive-tone and negative-tone development, and pattern effects, including pattern voids, are not observed. However, some pattern defects 1432 are observed, including an interconnection of the ends of the array of minimum pitch lines in the critical area 1414.

Figure 14E:
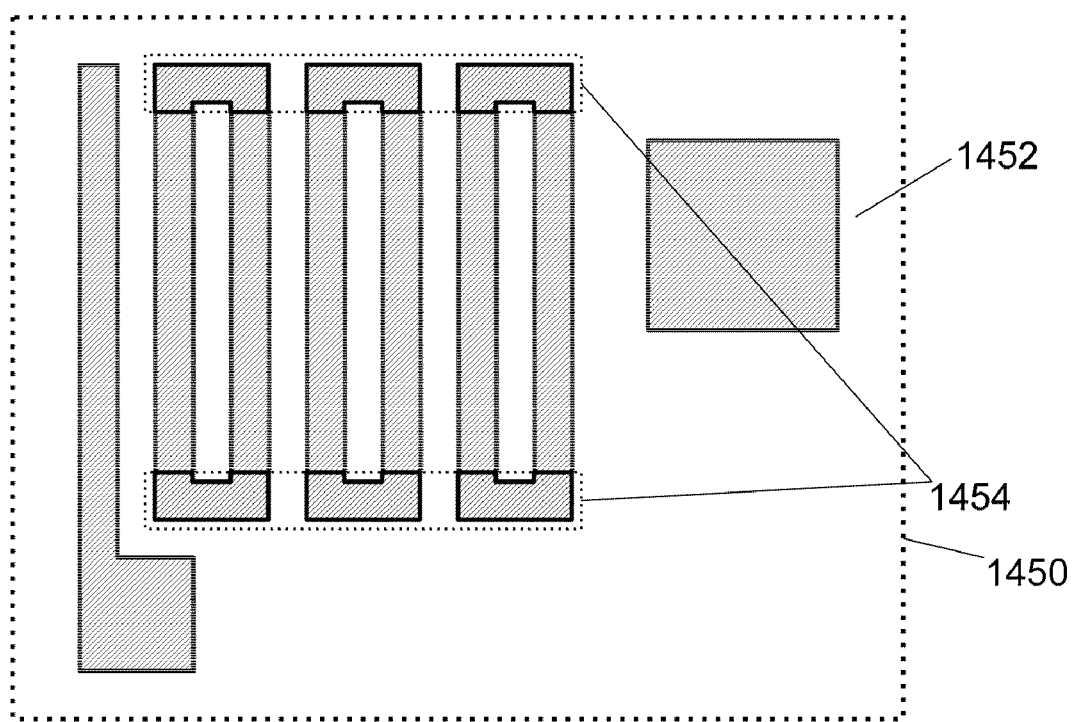
Figure 14F:
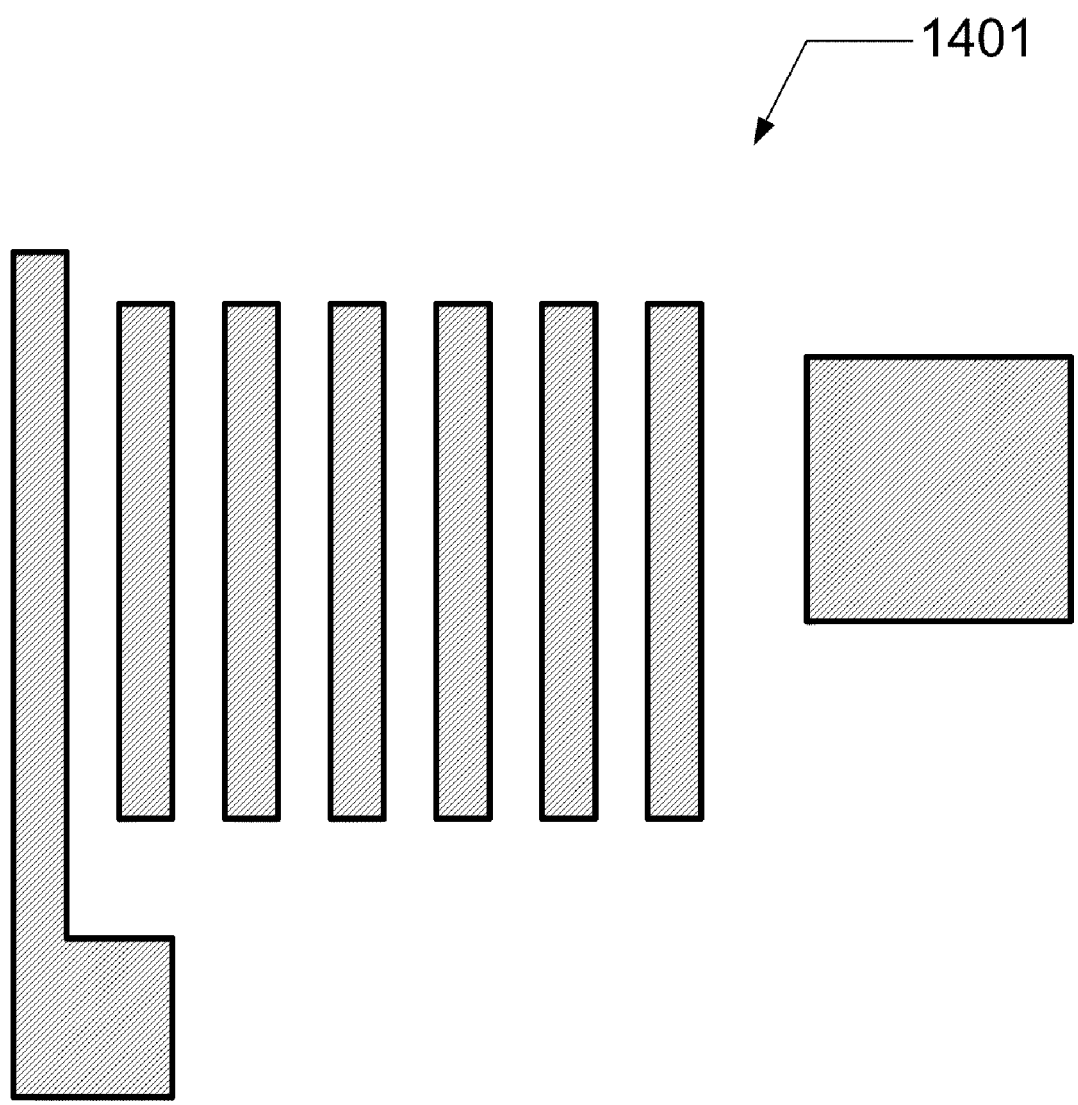

In FIG. 14E, another mask 1450 having opaque region 1452 and transparent regions 1454 is utilized with a second exposure to remove the observed pattern defects 1432, including the interconnection of the ends of the array of minimum pitch lines in the critical area 1414. As shown in FIG. 14F, the target layout 1401 is achieved.

Figure 15:
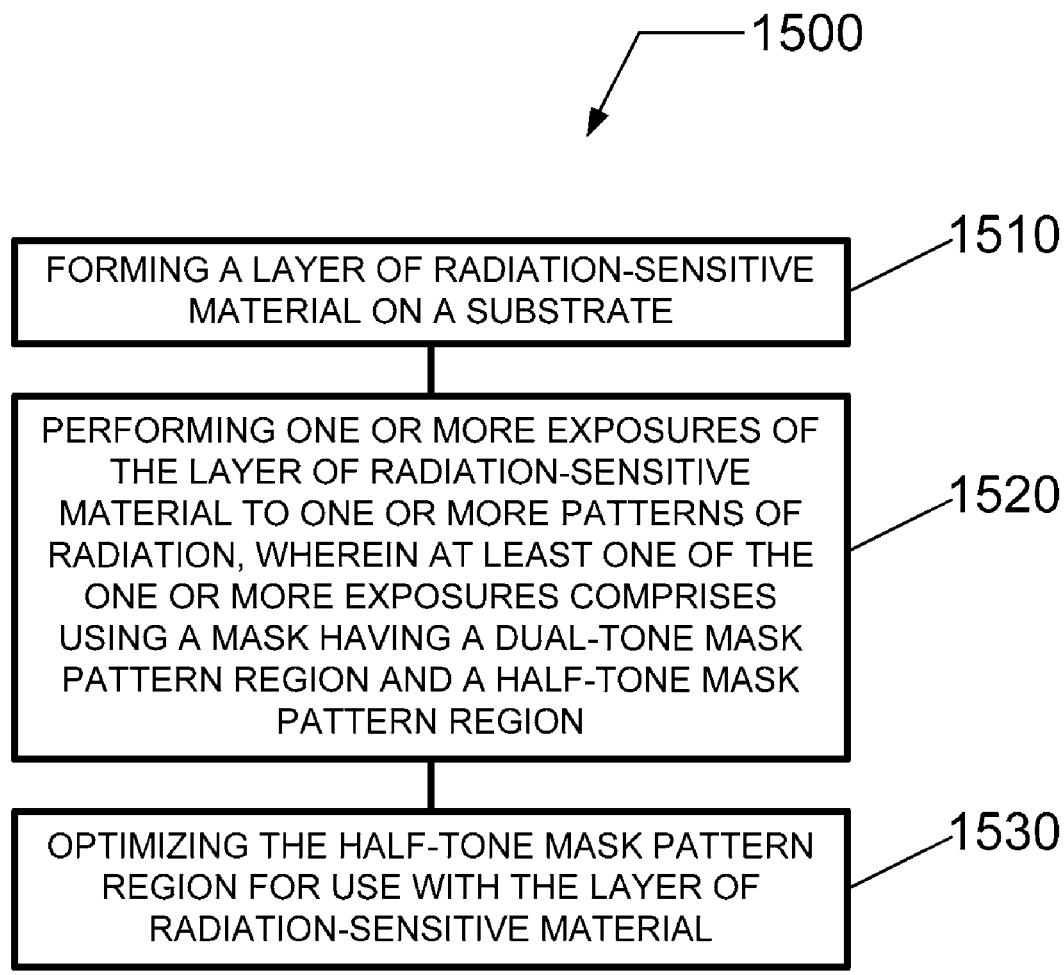
FIG. 15 provides a method of patterning a substrate according to an embodiment.

Referring now to FIG. 15, a method of patterning a substrate using a dual-tone development process is described according to an embodiment. As described above, a dual-tone development process is capable of printing dual-tone images for a given range of pitch dimensions. Additionally, the dual-tone development process comprises a well-defined dual-tone dissolution characteristic (i.e., contrast curve) that has adequate overlap between positive and negative tone dissolution characteristics (see FIGS. 9 through 11). Furthermore, a dual-tone development process is established for a given illumination condition, i.e., optical properties or settings of exposure system including coherent or incoherent radiation, shape of optics, numerical aperture (NA), wavelength ($\lambda$), etc.

The method comprises a flow chart 1500 beginning in 1510 with forming a layer of radiation-sensitive material on a substrate. The layer of radiation-sensitive material may comprise a photo-resist, including a dual-tone photo-resist or any one of the resists described above.

In 1520, the layer of radiation-sensitive material is exposed through one or more exposures to one or more patterns of radiation. Therein, at least one of the one or more exposures comprises using a mask having a dual-tone mask pattern region configured for printing dual-tone features and a half-tone mask pattern region configured for printing half-tone features.

In 1530, the half-tone mask pattern region is optimized for use with the layer of radiation-sensitive material. According to one embodiment, the optimizing comprises determining an optimal transmission of the half-tone mask pattern region. For example, an image intensity level may be selected and optimized to provide an adequate level of de-protection in the exposed layer of radiation-sensitive material. The level of de-protection may be such that the geometry remains following positive-tone and negative-tone development.

According to another embodiment, the half-tone mask pattern region may comprise an opaque region having a plurality of sub-resolution transparent features. The optimizing may comprise determining an optimal geometry of the plurality of sub-resolution transparent features as a function of exposure conditions and proximity environments using simulation, or experiment, or both. For example, the optimizing may comprise determining an optimal size of each of the plurality of sub-resolution transparent features, an optimal distribution of the plurality of sub-resolution transparent features, or an optimal spacing of each of the plurality of sub-resolution transparent features, or any combination of two or more thereof. The plurality of sub-resolution transparent features may comprise any arbitrary shape. For example, a sub-resolution transparent feature may comprise any geometrical shape including, but not limited to, a square, a rectangle, a high aspect ratio rectangle or line, a polygon, a triangle, a circle or circular shape, an oval or elliptical shape, etc.

Figure 16A:
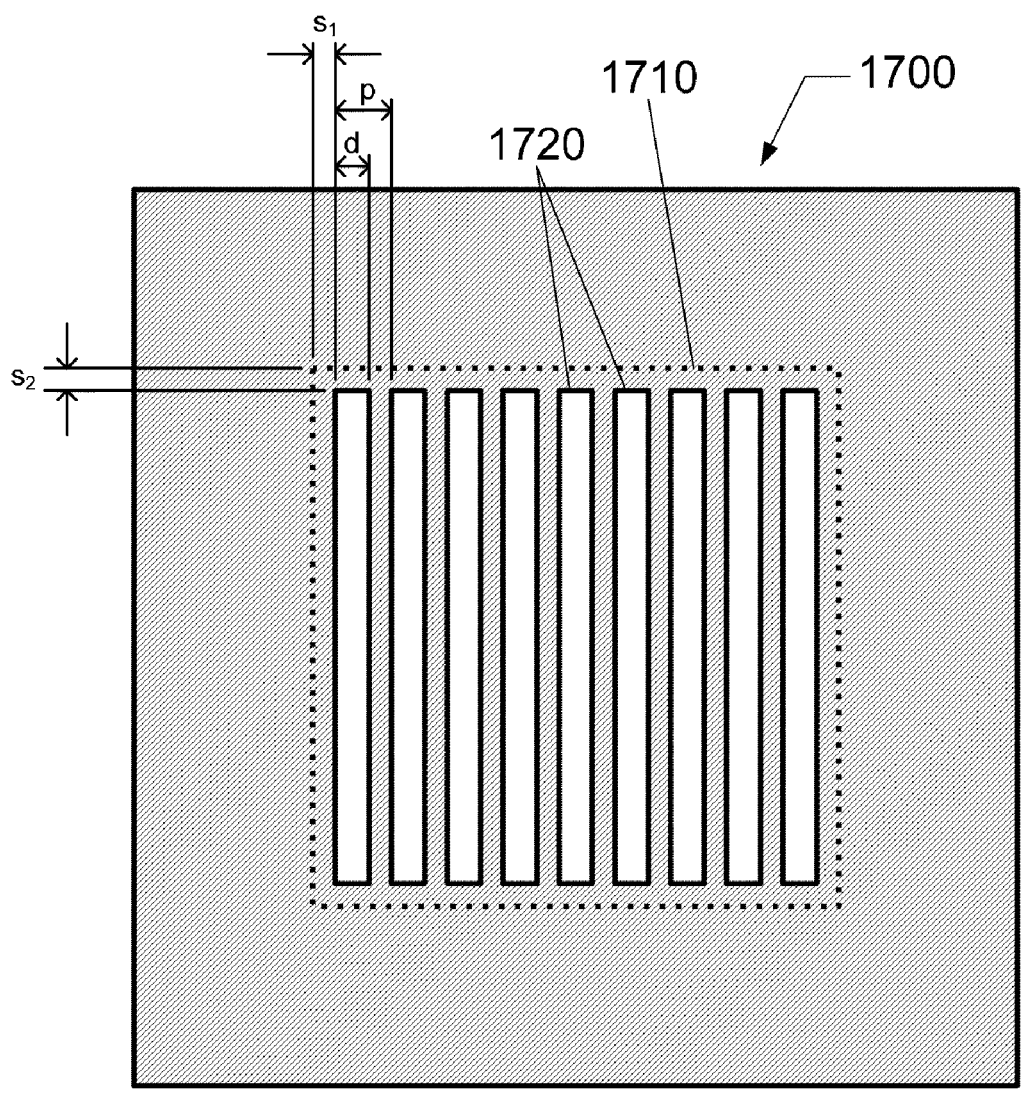
FIG. 16A shows a half-tone mask according to an embodiment.

As an example, FIG. 16A illustrates a gray-scaling mask 1700 for imaging a half-tone mask pattern region 1710. The gray-scaling mask 1700 comprises a one-dimensional array of transparent lines 1720. For example, the one-dimensional array of transparent lines 1720 may comprise an array of high aspect ratio rectangles, such as a sub-resolution grating. The one-dimensional array of transparent lines 1720 are characterized by a pitch (p), a duty cycle or ratio of the size of a transparent line (d) to the pitch, a first mask edge offset ($s_1$) from a first edge of the half-tone mask pattern region 1710, and a second mask edge offset ($s_2$) from a second edge of the half-tone mask pattern region 1710. The duty cycle may, for instance, be used to adjust or optimize the transmission of the half-tone mask pattern region 1710. The geometrical parameters described herein are exemplary and not intended to be limiting. The set of geometrical parameters needed to characterize the half-tone mask pattern region 1710 may be more or less.

The optimizing may comprise determining an optimal geometry of the sub-resolution gratings as a function of exposure conditions and proximity environments using simulation, or experiment, or both. For example, the optimizing may comprise determining an optimal pitch for the sub-resolution grating, an optimal size for the sub-resolution grating, an optimal duty-cycle for the sub-resolution grating, or an optimal mask edge offset for the sub-resolution grating, or any combination of two or more thereof.

Figure 16B:
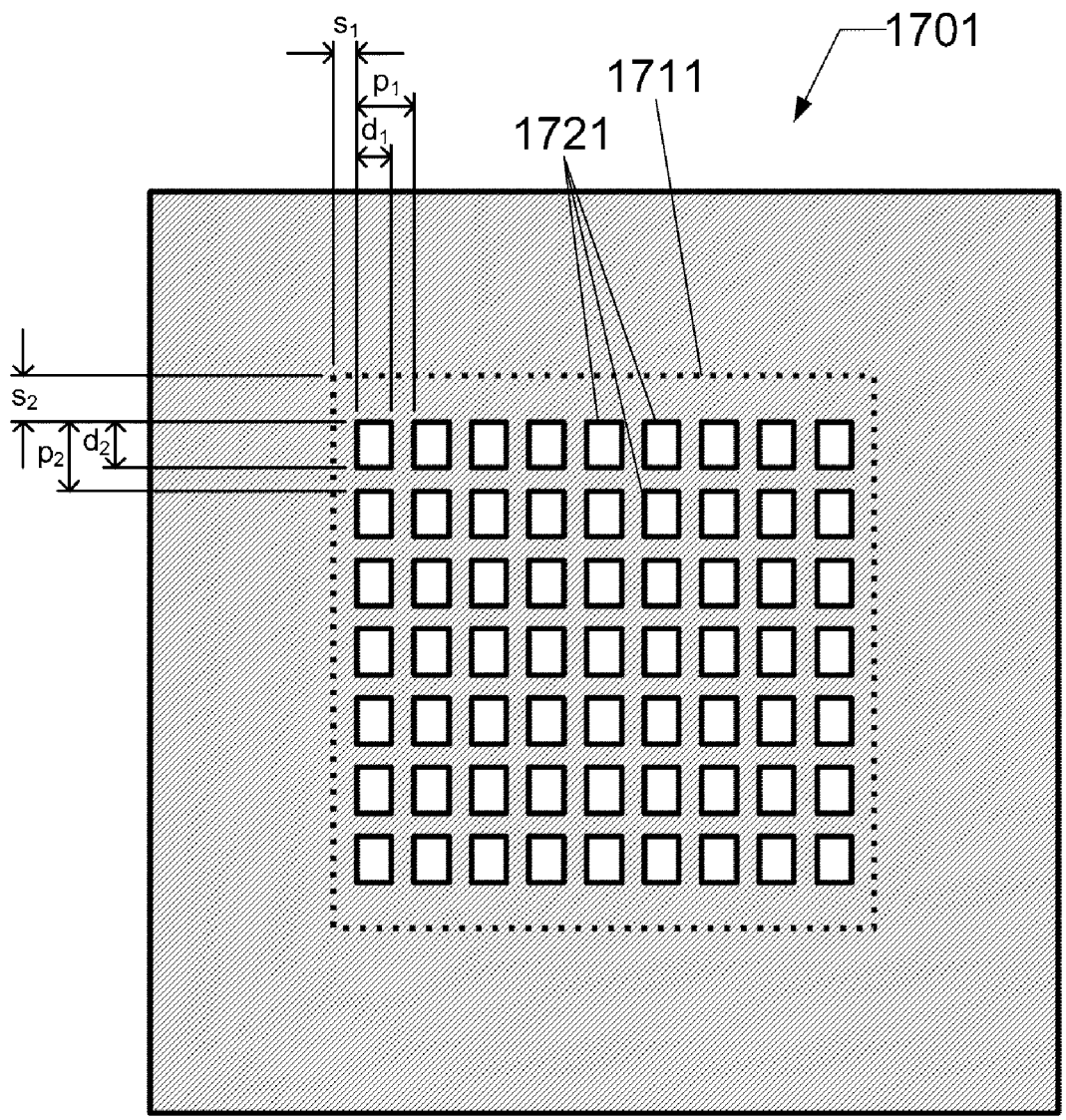
FIG. 16B shows a half-tone mask according to another embodiment.

As another example, FIG. 16B illustrates a gray-scaling mask 1701 for imaging a half-tone mask pattern region 1711. The gray-scaling mask 1701 comprises a two-dimensional array of transparent openings 1721. For example, the two-dimensional array of transparent openings 1721 may comprise a two-dimensional array of rectangular openings. The two-dimensional array of transparent openings 1721 are characterized by a first pitch ($p_1$), a first duty cycle or ratio of the width of a transparent opening ($d_1$) to the first pitch, a first mask edge offset ($s_1$) from a first edge of the half-tone mask pattern region 1711, a second pitch ($p_2$), a second duty cycle or ratio of the height of a transparent opening ($d_2$) to the second pitch, and a second mask edge offset ($s_2$) from a second edge of the half-tone mask pattern region 1711. The first and/or second duty cycle may, for instance, be used to adjust or optimize the transmission of the half-tone mask pattern region 1711. Although the two-dimensional array of transparent openings 1721 are positioned and spaced in a rectilinear manner, these openings may be ordered differently. Furthermore, the geometrical parameters described herein are exemplary and not intended to be limiting. The set of geometrical parameters needed to characterize the half-tone mask pattern region 1711 may be more or less.

The ordering of transparent openings in the half-tone mask pattern region, the shape of the transparent openings, and/or the number density of the transparent openings may be varied within the half-tone mask pattern region. For example, the mask pattern region may be sub-divided into sub-regions, wherein each sub-region may be characterized by a different openings shape, size, order, spacing, pitch, duty cycle, offset, etc.

The optimizing may comprise determining an optimal geometry of each of the two-dimensional array of transparent openings as a function of exposure conditions and proximity environments using simulation, or experiment, or both. For example, the optimizing may comprise determining an optimal pitch for the array of transparent openings, an optimal size for the array of transparent openings, an optimal duty-cycle for the array of transparent openings, an optimal distribution for the array of transparent openings, or an optimal mask edge offset for the array of transparent openings, or any combination of two or more thereof.

Figure 17:
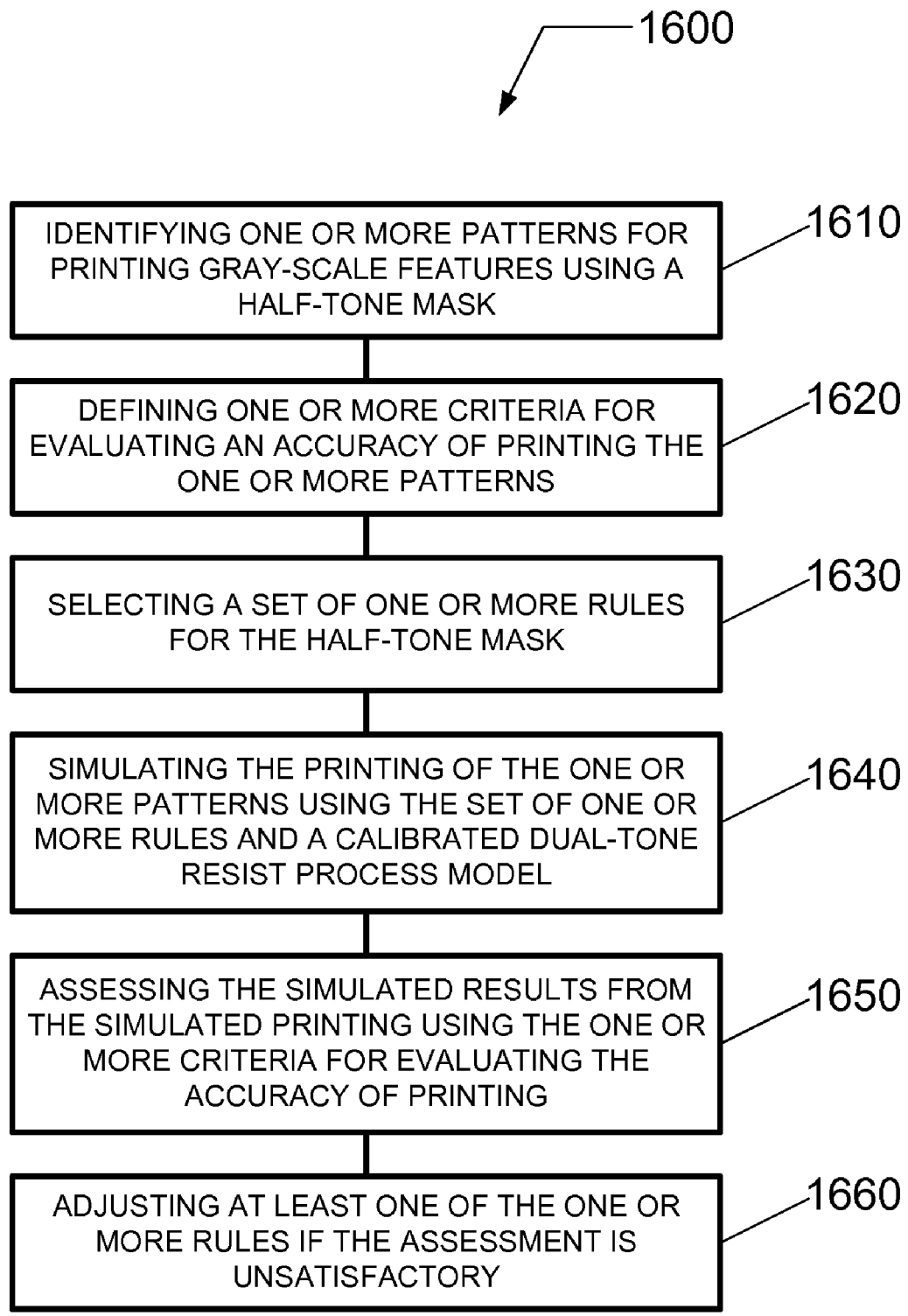
FIG. 17 provides a method of patterning a substrate according to another embodiment.

Referring now to FIG. 17, a method of optimizing gray-scale features in a dual-tone development process is described according to an embodiment. The method comprises a flow chart 1600 beginning in 1610 with identifying one or more patterns for printing gray-scale features using a half-tone mask with the dual-tone development process. As described above, a layout of features or patterns to be printed may be reviewed, and critical areas and less critical areas may be identified. Of the less critical areas, those areas suitable for gray-scaling are identified. For example, the size and/or spacing of features or patterns in less critical areas may be used to identify those areas suitable for gray-scaling.

In 1620, one or more criteria are defined for evaluating an accuracy of printing the one or more patterns using the half-tone mask with the dual-tone development process. For example, the one or more criteria may include a nominal critical dimension (CD) to be printed, a tolerance related to the nominal CD, a mask error factor (MEF), process latitude (e.g., exposure latitude and depth of focus (DOF)), common process latitude, etc.

In 1630, a set of one or more rules for the half-tone mask is selected. The one or more rules may include one or more design parameters, such as geometrical parameters, for preparing the half-tone mask.

In 1640, the printing of the one or more patterns is simulated using the set of one or more rules and a calibrated dual-tone resist process model. The dual-tone resist process model comprises a mathematical representation of the physical-chemical interactions that play out in a layer of radiation-sensitive material when exposed to a pattern of radiation, thermally treated, and subjected to a developing solution or solutions. The dual-tone resist process model may include an in-house developed model, or it may include a commercially available model provided by an EDA (Electronic Design Automation) vendor, such as Mentor Graphics Corporation (Wilsonville, Oreg.), or Synapsis Technology, Inc. (Spring House, Pa.).

The mathematical representation may include various mathematical equations and/or representations (e.g., ordinary/partial differential equations, etc.) that govern the resist imaging physics, or experimentally determined empirical relationships, or combination thereof. The inputs to the simulation may include the optical/EM radiation properties of the exposure, the mask geometry, the physical/chemical/thermal properties of the dual-tone resist, the developing chemistry, etc., as well as various environmental conditions during each step such as temperature, pressure, etc., and time. The resist model may be experimentally calibrated for a dual-tone resist of particular interest.

In 1650, simulated results from the simulated printing of the one or more patterns are assessed using the one or more criteria for evaluating the accuracy of the printing.

In 1660, at least one of the one or more rules is adjusted if the assessment is unsatisfactory. If the simulated results do not meet any one of the one or more criteria for evaluating the accuracy of the printing, then the assessment may be deemed unsatisfactory. For example, a simulated CD may be compared with a target CD, or a simulated MEF may be compared with a target MEF, etc. If the simulated CD differs from the target CD by an amount greater than an acceptable tolerance, then the assessment may be deemed unsatisfactory. Alternatively, if the simulated MEF is greater than the target MEF, then the assessment may be deemed unsatisfactory.

According to one embodiment, the selection of one or more rules may comprise selecting a level of transmission for the half-tone mask. Thereafter, the level of transmission for the half-tone mask may be adjusted based upon the outcome of the assessment of the simulated results.

According to another embodiment, the selection of one or more rules may comprise defining an arrangement of mask features for the half-tone mask configured to be used with the dual-tone development process. The arrangement of mask features may comprise an opaque region having a plurality of sub-resolution transparent features configured to conform to the one or more patterns. For example, the plurality of sub-resolution transparent features may include a one-dimensional array of transparent lines, or a two-dimensional array of transparent openings as discussed above.

A nominal sub-resolution pitch is computed for the plurality of sub-resolution transparent features in at least one direction within the arrangement of mask features. For example, the pitch (p) for a one-dimensional array of transparent lines, or the first and second pitch ($p_1$ and $p_2$). For example, the nominal pitch may be computed via the following:

$$p_{nom} = \lambda / [(\sigma_{max}+1)NA],$$

where $\lambda$ is the wavelength, $\sigma_{max}$ is the maximum partial coherence in the illumination mode used, and NA is the numerical aperture for the exposure system. Using the computed nominal sub-resolution pitch, a sub-resolution pitch ($p_{sel}$) for the plurality of sub-resolution transparent features in at least one direction within the arrangement of mask features is selected. For example, the sub-resolution pitch ($p_{sel}$) may be selected as follows:

$$p_{min} < p_{sel} \leq p_{nom},$$

wherein $p_{min}$ represents a minimum value for the sub-resolution pitch. The minimum value may be dictated by mask fabrication capability. The selected pitch may be such that an integer number of transparent features exist across the width and/or height of the half-tone mask, and this condition is met.

Additionally, a duty cycle for the plurality of sub-resolution transparent features in at least one direction within the arrangement of mask features. The duty cycle (which may represent the fraction of the pitch that is transparent or opaque) may be used to control the level of transmission through the half-tone mask. Furthermore, a mask edge offset for the plurality of sub-resolution transparent features in at least one direction within the arrangement of mask features may be selected.

Upon selecting a pitch, a duty cycle, and a mask edge offset, for example, the printing of the one or more patterns using the half-tone mask with the selected rules applied may be simulated. Depending upon the simulated results and the one or more criteria defined for assessing the simulated results, the pitch, the duty cycle, and/or the mask edge offset may be adjusted.

The method may further include experimentally verifying an accuracy of printing the one or more patterns following the assessment if the assessment of the simulated results is satisfactory.

Figure 18:
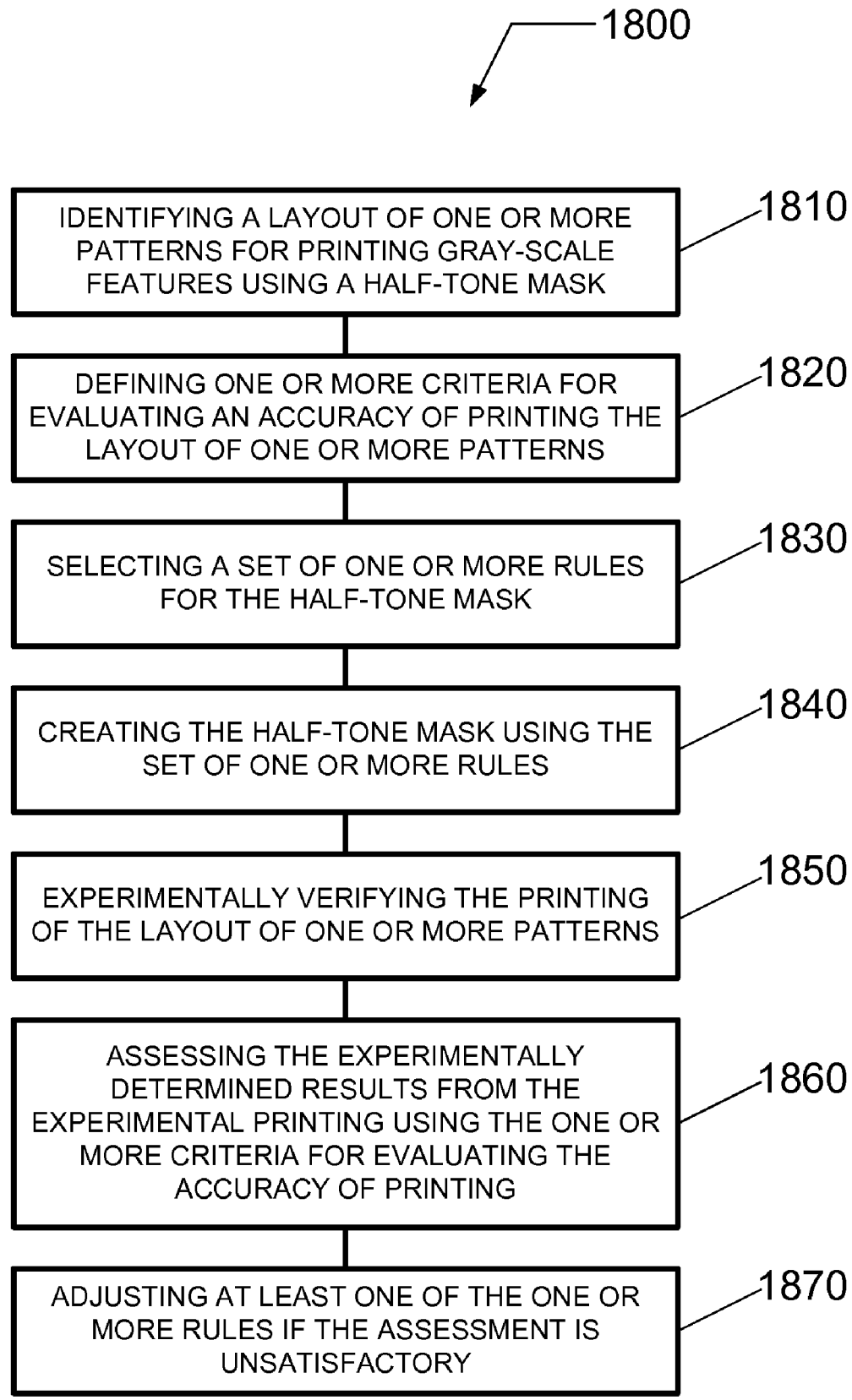
FIG. 18 provides a method of patterning a substrate according to another embodiment.

Referring now to FIG. 18, a method of optimizing gray-scale features in a dual-tone development process is described according to another embodiment. The method comprises a flow chart 1800 beginning in 1810 with preparing a layout of one or more patterns for printing gray-scale features using a half-tone mask with the dual-tone development process. As described above, a layout of features or patterns to be printed may be reviewed, and critical areas and less critical areas may be identified. Of the less critical areas, those areas suitable for gray-scaling are identified. For example, the size and/or spacing of features or patterns in less critical areas may be used to identify those areas suitable for gray-scaling.

In 1820, one or more criteria are defined for evaluating an accuracy of printing the one or more patterns using the half-tone mask with the dual-tone development process. For example, the one or more criteria may include a nominal critical dimension (CD) to be printed, a tolerance related to the nominal CD, a mask error factor (MEF), process latitude (e.g., exposure latitude and depth of focus (DOF)), common process latitude, etc.

In 1830, a set of one or more rules for the half-tone mask is selected. The one or more rules may include one or more design parameters, such as geometrical parameters, for preparing the half-tone mask.

In 1840, a half-tone mask is created or manufactured using the set of one or more rules.

In 1850, printing of the one or more patterns is experimentally verified using the half-tone mask.

In 1860, the experimentally determined results from the experimental printing of the layout of one or more patterns are assessed using the one or more criteria for evaluating the accuracy of the printing.

In 1870, at least one of the one or more rules is adjusted if the assessment is unsatisfactory. If the experimentally determined results do not meet any one of the one or more criteria for evaluating the accuracy of the printing, then the assessment may be deemed unsatisfactory. For example, an experimentally determined CD may be compared with a target CD, or an experimentally determined MEF may be compared with a target MEF, etc. If the experimentally determined CD differs from the target CD by an amount greater than an acceptable tolerance, then the assessment may be deemed unsatisfactory. Alternatively, if the experimentally determined MEF is greater than the target MEF, then the assessment may be deemed unsatisfactory.

According to one embodiment, the selection of one or more rules may comprise selecting a level of transmission for the half-tone mask. Thereafter, the level of transmission for the half-tone mask may be adjusted based upon the outcome of the assessment of the simulated results.

According to another embodiment, the selection of one or more rules may comprise defining an arrangement of mask features for the half-tone mask configured to be used with the dual-tone development process. The arrangement of mask features may comprise an opaque region having a plurality of sub-resolution transparent features configured to conform to the one or more patterns. For example, the plurality of sub-resolution transparent features may include a one-dimensional array of transparent lines, or a two-dimensional array of transparent openings as discussed above.

A nominal sub-resolution pitch is computed for the plurality of sub-resolution transparent features in at least one direction within the arrangement of mask features. For example, the pitch (p) for a one-dimensional array of transparent lines, or the first and second pitch ($p_1$ and $p_2$). For example, the nominal pitch may be computed via the following:

$$p_{nom} = \lambda / [(\sigma_{max} + 1) NA],$$

where $\lambda$ is the wavelength, $\sigma_{max}$ is the maximum partial coherence in the illumination mode used, and NA is the numerical aperture for the exposure system. Using the computed nominal sub-resolution pitch, a sub-resolution pitch ($p_{sel}$) for the plurality of sub-resolution transparent features in at least one direction within the arrangement of mask features is selected. For example, the sub-resolution pitch ($p_{sel}$) may be selected as follows:

$$p_{min} < p_{sel} < p_{nom},$$

wherein $p_{min}$ represents a minimum value for the sub-resolution pitch. The minimum value may be dictated by mask fabrication capability. The selected pitch may be such that an integer number of transparent features exist across the width and/or height of the half-tone mask, and this condition is met.

Additionally, a duty cycle for the plurality of sub-resolution transparent features in at least one direction within the arrangement of mask features. The duty cycle (which may represent the fraction of the pitch that is transparent or opaque) may be used to control the level of transmission through the half-tone mask. Furthermore, a mask edge offset for the plurality of sub-resolution transparent features in at least one direction within the arrangement of mask features may be selected.

Upon selecting a pitch, a duty cycle, and a mask edge offset, for example, the printing of the one or more patterns using the half-tone mask with the selected rules applied may be simulated. Depending upon the simulated results and the one or more criteria defined for assessing the simulated results, the pitch, the duty cycle, and/or the mask edge offset may be adjusted.

Figure 19:
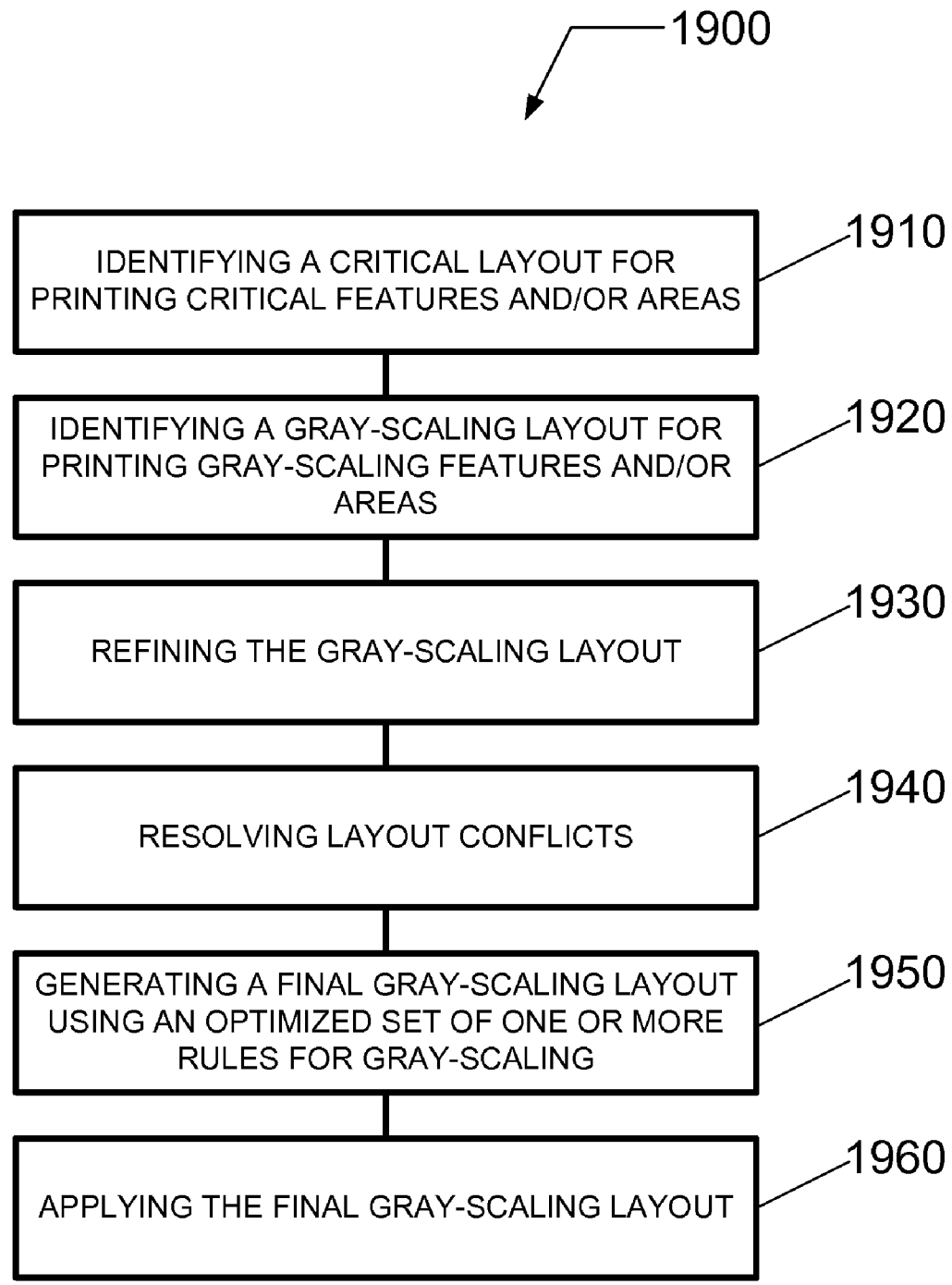
FIG. 19 provides a method of patterning a substrate according to yet another embodiment.
Figure 20A:
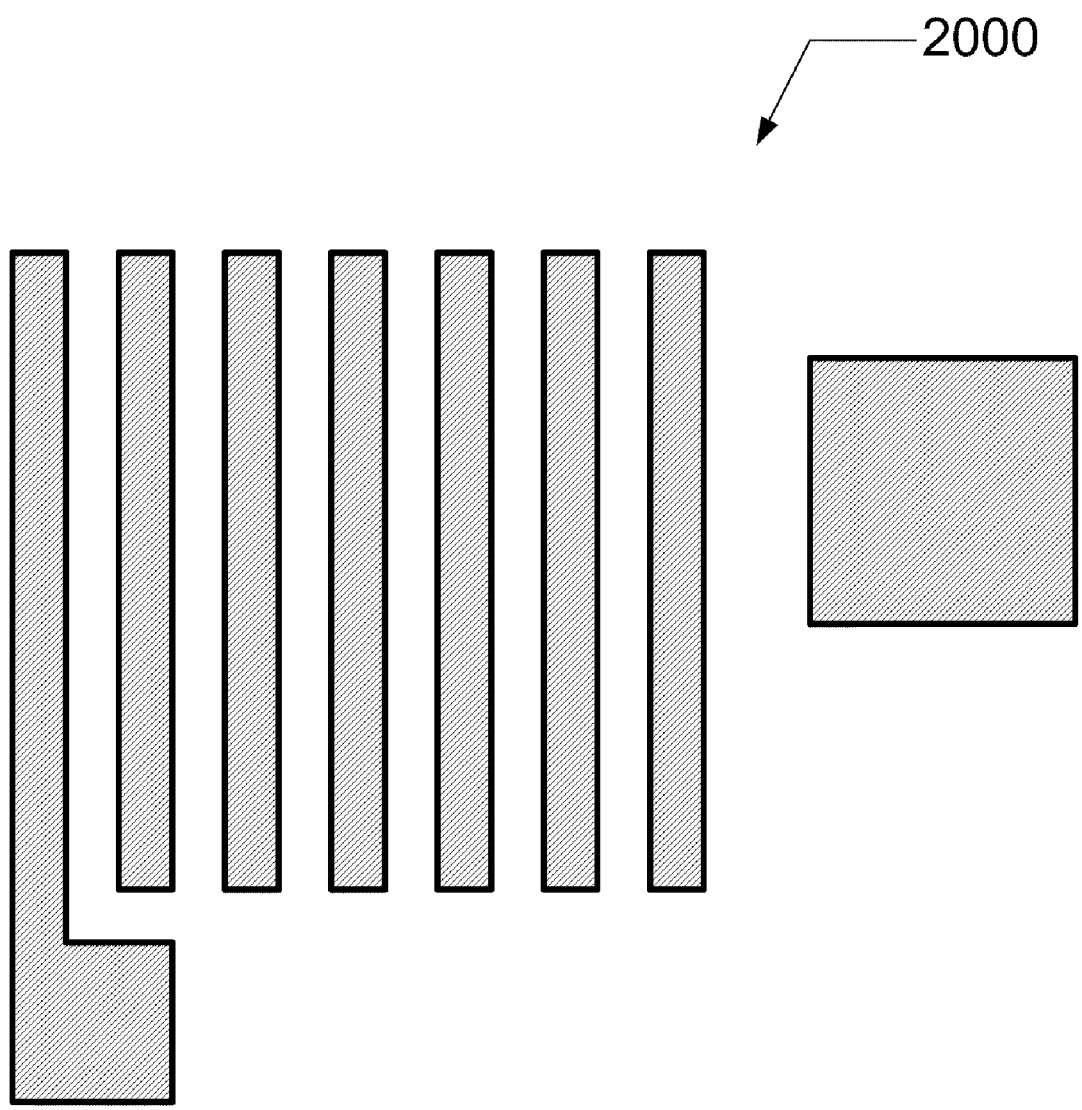
FIGS. 20A and 20B illustrate a pattern layout for patterning a substrate.
Figure 20B:
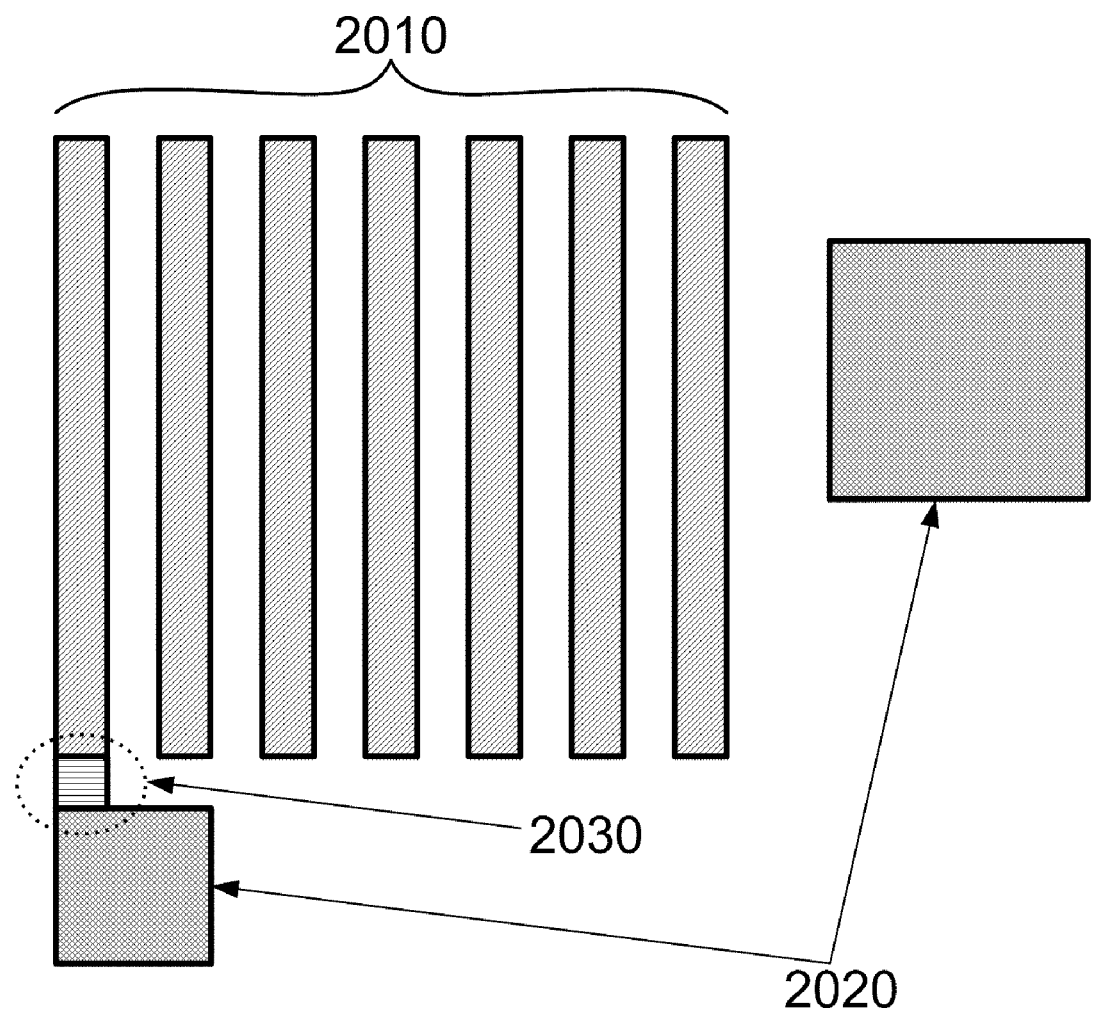

Referring now to FIG. 19, a method of patterning a substrate using a dual-tone development process is described according to yet another embodiment. The method comprises a flow chart 1900 beginning in 1910 with indentifying a critical layout for printing critical features and/or areas. For example, as shown in FIG. 20, a layout 2000 of one or more patterns is illustrated. Then, as shown in FIG. 20B, a critical layout 2010 is identified for critical areas and/or features. Critical areas may include finer features requiring more stringent lithographic printing tolerances such as minimum pitch features, gate structures, etc.

In 1920, a gray-scaling layout for printing gray-scaling features and/or areas is identified. As shown in FIG. 20B, a less critical layout 2020 is identified for less areas and/or features. Less critical features may include larger features (relative to minimum dimension features) requiring less stringent lithographic printing tolerances such as landing pads, border features, label characters, etc. The less critical areas may be suitable for gray-scaling. According to one embodiment, the gray-scaling layout includes those areas remaining after identification of the critical layout or critical areas. When identifying the critical layout and/or less critical layout (or gray-scaling layout), electronic design automation (EDA) software may be used.

In 1930, the gray-scaling layout is refined. As illustrated in FIGS. 20A and 20B, the critical layout and the gray-scaling layout are identified. However, some areas may be identified that have a marginal level of criticality. For example, a marginally critical layout 2030 may be identified as one that exists between the critical layout 2010 and the less critical layout 2020. According to one embodiment, the marginally critical layout 2030 may be treated using rules defined for handling the critical layout 2010. According to another embodiment, the marginally critical layout 2030 may be treated using rules defined for handling the less critical or gray-scaling layout 2020.

In 1940, layout conflicts are resolved. In some instances, the proximity of one pattern treated as less critical to another pattern treated as critical is such that one or more rules for the less critical pattern and/or the critical pattern requires adjustment. For example, the proximity of the array of minimum pitch lines (e.g., critical layout 2010) to the larger square feature (e.g., portion of the less critical layout 2020) off to the right of the array of minimum pitch lines may be such that one or more rules for the larger square feature (e.g., portion of the less critical layout 2020) requires adjustment. Additionally, for example, one or more rules associated with the mask design proximate the left edge of the larger square feature may be adjusted accordingly.

In 1950, a final gray-scaling layout is generated using an optimized set of one or more rules for gray-scaling and, in 1960, the final gray-scaling layout is applied.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method of patterning a substrate using a dual-tone development process, comprising:
providing a substrate having a layer of radiation-sensitive material on said substrate, wherein said layer of radiation-sensitive material comprises a dual tone photo-resist;
providing a mask having a dual-tone mask pattern region configured for printing dual-tone features and a half-tone mask pattern region configured for printing half-tone features;
performing a dual-tone development process by performing one or more exposures of said layer of radiation-sensitive material to one or more patterns of radiation to print said dual-tone features in said dual tone photo-resist with a double pattern in said dual-tone mask pattern region and print half-tone features in said dual tone photo-resist without a double pattern in said half-tone mask pattern region; and
selecting mask properties of said half-tone mask pattern region for use with said dual tone photo-resist such that said dual-tone development process avoids producing pattern defects that include an undesirable void in half-tone features printed by said dual-tone development process.

2. The method of claim 1, wherein said selecting mask properties comprises determining an optimal transmission of said half-tone mask pattern region.

3. The method of claim 1, wherein said half-tone mask pattern region comprises an opaque region having a plurality of sub-resolution transparent features.

4. The method of claim 3, wherein said selecting mask properties comprises determining an optimal geometry of said plurality of sub-resolution transparent features as a function of exposure conditions and proximity environments using simulation, or experiment, or both.

5. The method of claim 3, wherein said selecting mask properties comprises determining an optimal size of each of said plurality of sub-resolution transparent features, or an optimal spacing of each of said plurality of sub-resolution transparent features, or both the optimal size and spacing of said plurality of sub-resolution transparent features.

6. The method of claim 3, wherein each of said plurality of sub-resolution transparent features comprises any arbitrary shape.

7. The method of claim 1, wherein said half-tone mask pattern region comprises a sub-resolution grating.

8. The method of claim 7, wherein said selecting mask properties comprises determining an optimal geometry of said sub-resolution grating as a function of exposure conditions and proximity environments using simulation, or experiment, or both.

9. The method of claim 8, wherein said selecting mask properties comprises determining an optimal pitch for said sub-resolution grating, an optimal size for said sub-resolution grating, an optimal duty-cycle for said sub-resolution grating, or an optimal mask edge offset for said sub-resolution grating, or any combination of two or more thereof.

10. The method of claim 1, wherein said dual-tone photo-resist comprises a photo-resist that switches solubility due to a change in polarity upon said exposing to said one or more patterns of radiation and optionally elevating a temperature of said substrate to a first post-exposure temperature, or a second post-exposure temperature, or both following said exposing.

11. The method of claim 1, wherein said dual-tone photo-resist comprises a photo-resist that provides acid-catalyzed deprotection upon said exposing to said one or more patterns of radiation and optionally elevating a temperature of said substrate to a first post-exposure temperature, or a second post-exposure temperature, or both following said exposing.

* * * * *